United States Patent [19]
Toda

[11] Patent Number: 6,085,283
[45] Date of Patent: Jul. 4, 2000

[54] DATA SELECTING MEMORY DEVICE AND SELECTED DATA TRANSFER DEVICE

[75] Inventor: Haruki Toda, Yokohama, Japan

[73] Assignee: Kabushiki Kaisha Toshiba, Kawasaki, Japan

[21] Appl. No.: 08/873,514

[22] Filed: Jun. 12, 1997

Related U.S. Application Data

[63] Continuation of application No. 08/341,754, Nov. 18, 1994, abandoned.

[30] Foreign Application Priority Data

Nov. 19, 1993 [JP] Japan .................................... 5-290962

[51] Int. Cl.⁷ .................................................. G06F 12/00
[52] U.S. Cl. .......................... 711/104; 711/100; 711/105; 711/154; 365/189.05; 365/230.01
[58] Field of Search ......................... 365/230.01, 189.05; 711/100, 104, 105, 154

[56] References Cited

U.S. PATENT DOCUMENTS

| | | | |
|---|---|---|---|
| 4,296,475 | 10/1981 | Nederlof et al. ......................... | 395/435 |
| 4,644,502 | 2/1987 | Kawashima ............................. | 365/219 |
| 4,855,957 | 8/1989 | Nogumi ............................. | 365/230.03 |
| 4,855,959 | 8/1989 | Kobayashi ............................. | 365/239 |
| 4,933,835 | 6/1990 | Sachs et al. ............................. | 395/450 |
| 4,989,180 | 1/1991 | Lipovski ............................. | 365/189.07 |
| 5,392,254 | 2/1995 | Toda ......................................... | 365/240 |
| 5,479,373 | 12/1995 | Takeuchi et al. .................. | 365/230.03 |
| 5,508,970 | 4/1996 | Toda ......................................... | 365/240 |

OTHER PUBLICATIONS

Kimura, Katsutaka, et al., "A Block–Oriented RAM with Half–Sized DRAM Cell and Quasi–Folded Data–Line Architecture", IEEE Journal of Solid–State Circuits, vol. 26, No. 11, Nov. 1991, pp. 1511–1518.

*Primary Examiner*—Tuan V. Thai
*Attorney, Agent, or Firm*—Hogan & Hartson, LLP

[57] ABSTRACT

A selective data memory device includes skip and sequential read circuits that connect input/output lines for inputting and outputting string data, and data set corresponding to the string data, to bit lines. String bit registers temporarily store data on the string data line for inputting selecting string data, and bit comparators compare the string data on the bit lines of the memory cells with data stored in the string bit registers. The string data on the bit lines can be selected by the bit comparators. On the basis of the comparison results, specific data is written in a specific bit position of the bit lines by string match mark circuits. On the basis of the specific bit data, the skip and sequential read circuits can access the memory cells. Therefore, a key string data access is enabled, and it is possible to realize a large capacity memory device for enabling an effective data set access in match with key string data.

35 Claims, 19 Drawing Sheets

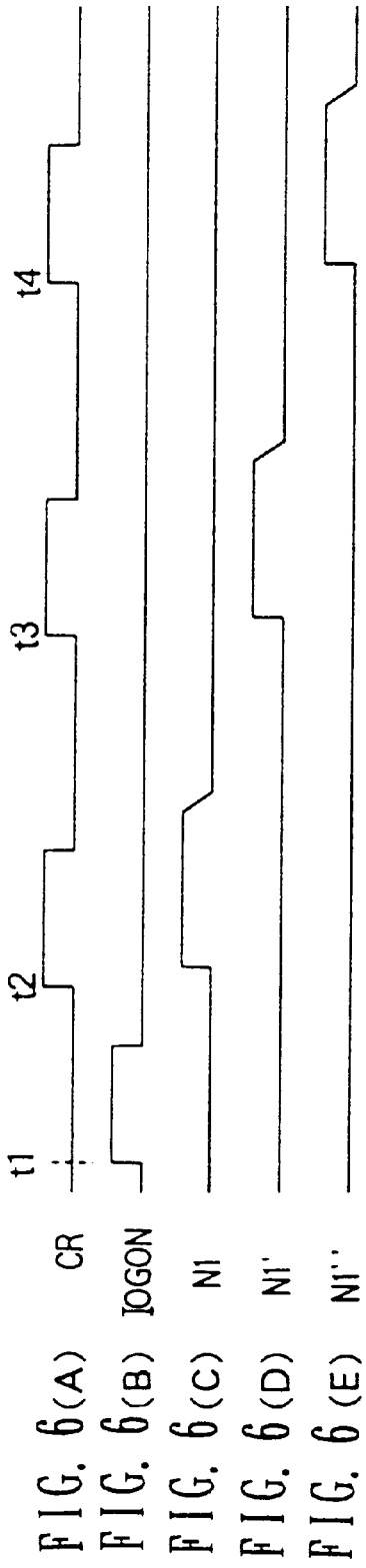

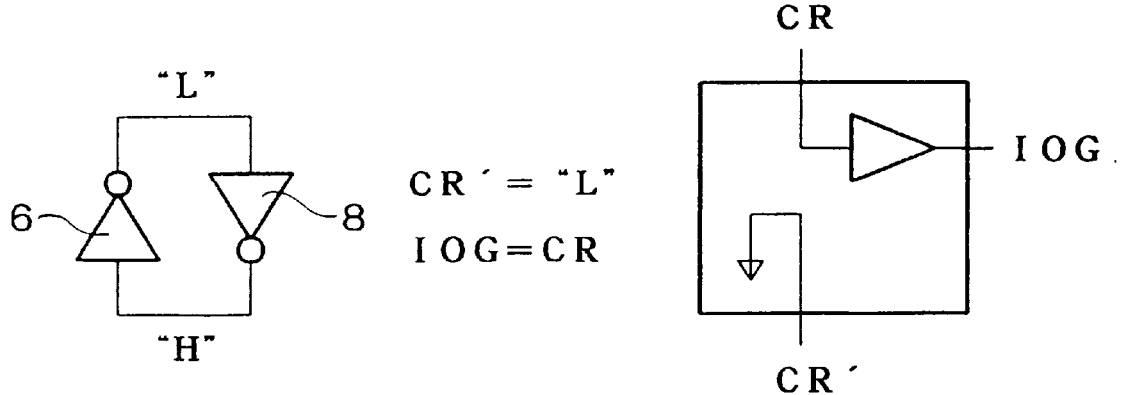
FIG. 7(a) STATUS OF "1"
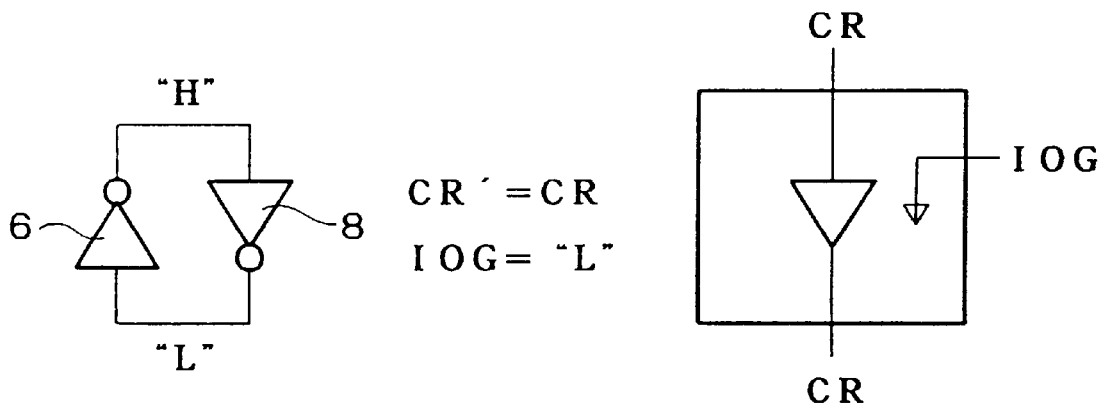
FIG. 7(b) STATUS OF "0"

(ORDINARY MEMORY ACCESS)

(KEY STRING DATA ACCESS)

DATA SELECTING MEMORY DEVICE AND SELECTED DATA TRANSFER DEVICE

This is a continuation of application Ser. No. 08/341,754, filed Nov. 18, 1994, now abandoned.

FIELD OF THE INVENTION

The present invention relates to a selective data memory device and a selected data transfer device, and more specifically to a selective data memory device and a selected data transfer device of a large capacity, which can effectively access a data set whose key string matches.

BACKGROUND ART

With the recent advance in the capacity of semiconductor memory devices, the quantity of data processed by an information apparatus has been increased greatly. Under these circumstances, the data selection for finding out data which satisfy some conditions from a great amount of accumulated data has become more important.

On the other hand, in the ordinary memory device, as shown in FIG. 20, an address Add is allocated to a cell data CD in a one-to-one corresponding relationship. Therefore, when data are required to be selected, it is necessary to access all the addresses to read all the cell data and further to select some data from all the cell data. However, when the memory capacity increases, the times required for both memory access and data selection increase markedly according to the increased memory capacity.

To overcome the above-mentioned situation, a method of accessing data by reference to data contents (referred to as key string data access, hereinafter) has been proposed. In this method, a part of a group of data stored in the memory device is determined as key string data; key string data are given for each memory access; and a group of data whose key string data matches the given key string data are accessed.

FIG. 21 shows a conceptual illustration explaining key string data access. For example, in the case of an 8-bit key string, the key string data KSD can be set to any one of $2^8$ states. It is optional as to which data set DS corresponds to one key string data. For instance, it is possible to allow a data set DSO (enclosed by a solid line) or a data set DS1 (enclosed by a dashed line) to correspond to the key string data. When a data set stored in correspondence to a key string data as described above is required to be read from the memory, the data set can be read by giving the key string data, without reading all the data stored in the memory device.

A dynamic memory of key string data access type, which is suitable for data selection in a large-capacity memory, is disclosed in U.S. Pat. No. 4,989,180 entitled "Dynamic Memory with Logic-in-Refresh." According to the disclosure of this patent, the dynamic memory refresh and the data selection based upon the key string data are executed simultaneously. When a match of the key string data is detected, a specific bit of the detected data is written as a mark bit. Further, when data is read, this bit data is read by detecting the mark bit. If a plurality of matched data sets exist in a selected row, a priority circuit selects only one matched data and outputs the selected matched data. The second and beyond matched data are read by selecting the rows again to read the matched data set.

In the above-mentioned prior art memory device of key string data access type, the key string data access can be technically realized, but it is practically impossible to apply this prior art memory device to a large capacity memory device such as DRAM, for instance. In addition, when a plurality of data to be read exist in the same row, there exists a problem in that the data reading efficiency is degraded markedly.

SUMMARY OF THE INVENTION

With these problems in mind, therefore, it is the object of the present invention to provide a large capacity selective data memory device and a large capacity selected data transfer device for enabling the key string data access and for enabling a highly efficient access to a data set which matches the key string data.

To achieve the above-mentioned object, the present invention provides a selective data memory device which comprises: a memory cell array composed of a plurality of memory cells arranged into a matrix pattern and divided into a plurality of column blocks; and selected data transferring means for comparing externally inputted string data with data in each column, marking some of the column blocks according to the comparison results, and transferring and outputting data in the marked column blocks in sequence.

In the selective data memory device according to the present invention, the externally input string data are compared with the data in the respective column blocks, and some of the column blocks are marked according to the comparison results for data selection. Further in the succeeding step, data in the marked columns are transferred by the selected data transferring means. As a result, it is possible to realize key string data access and an effective access to a data set that matches the key string data.

Further, in the selective data memory device according to the present invention, it is possible to write specific data in the cell data string on the basis of an externally supplied data string so that only the written cell data string can be read. Further, in the selected data transfer device according to the present invention, it is possible to transfer the cell data string in which previously determined specific data have been written on the basis of an externally applied reiterative pulse drive signal.

BRIEF DESCRIPTION OF THE DRAWINGS

FIG. 6 is a timing chart explaining the operation of the skip and sequential read circuit;

FIGS. 7(a) and 7(b) are circuit diagrams explaining the operation of the skip and sequential read circuit;

PREFERRED EMBODIMENTS OF THE INVENTION

Preferred embodiments of the present invention will be described hereinbelow with reference to the attached drawings.

Figure 1:
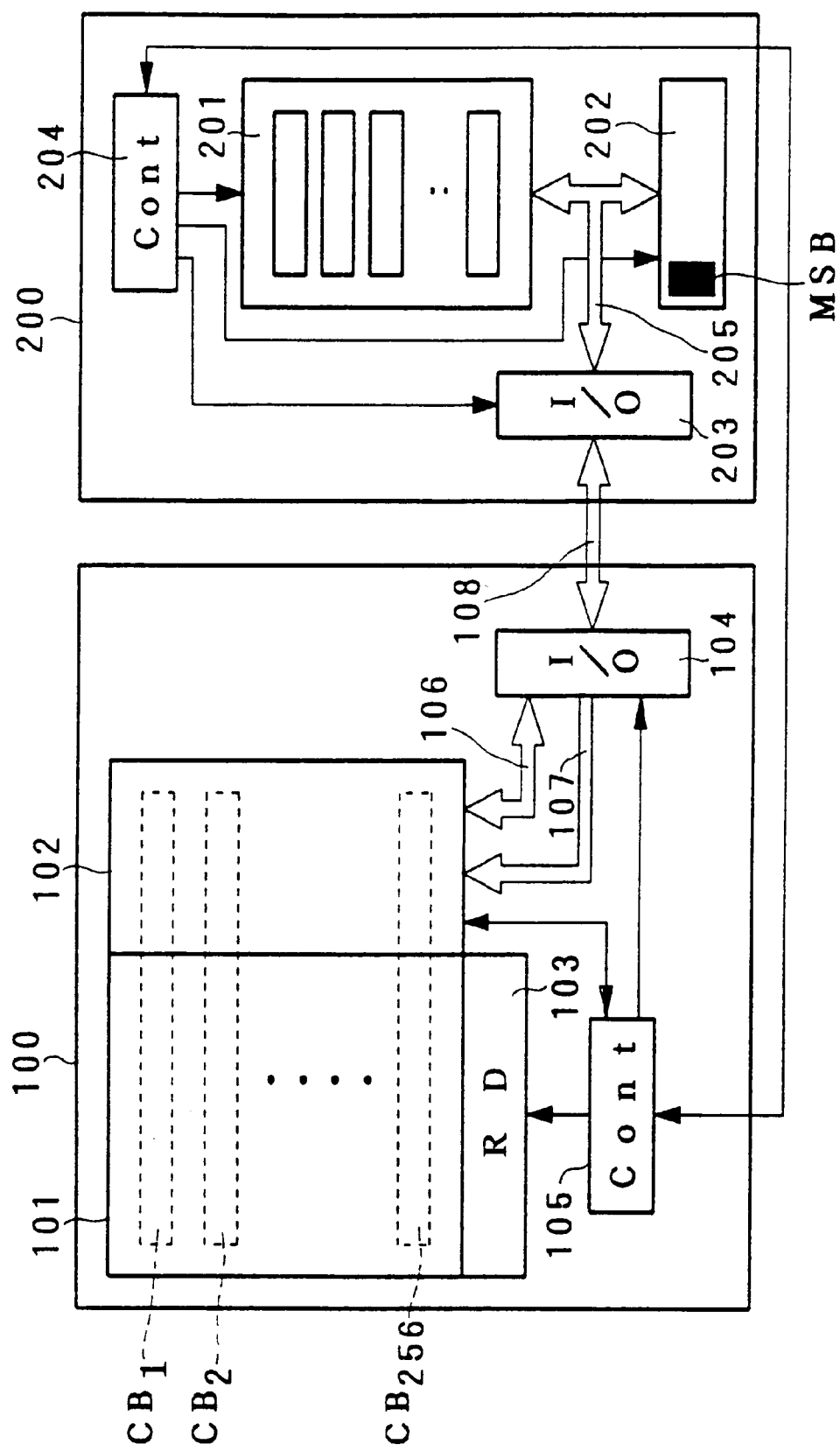
FIG. 1 is a block diagram showing a first embodiment of the selective data memory device according to the present invention and its peripheral circuits.

FIG. 1 is a schematic block diagram showing a selective data memory system that includes a selective data memory device according to a first embodiment of the present invention. The selective data memory system is composed of a selective data memory device 100 and a select control circuit 200 both being connected to each other through an external bus 108.

The selective data memory device 100 is composed of a memory cell array 101, a selected data transfer circuit 102, a row decode circuit 103, a data input/output circuit 104, and a control circuit 105. The memory cell array 101 and the selected data transfer circuit 102 are both divided into a plurality of column blocks CB, and data are transferred for each column block. Further, the selected data transfer circuit 102 and the data input/output circuit 104 are connected through a data bus 106 and a string data bus 107.

The memory cell array 101 is formed by arranging a plurality of memory cells into a matrix pattern. The memory cells are of random access memory type (such as dynamic type ("DRAM") cells, static type cells, or masked ROM (i.e., read-only) cells), or writable and erasable non-volatile memory cells.

The selected data transfer circuit 102 compares read data with string data, which is either input externally or obtained in the preceding cycle for each column block, and transfers the read data on the basis of the comparison results. The data transfer is executed in sequence on the basis of a clock signal given by the control circuit 105. The data transfer is not executed for all the data in all the column blocks, but executed partially on the basis of the comparison results. As described below, since the selected data transfer circuit 102 transfers data partially on the basis of the comparison results, it is possible to improve the data selection speed.

The control circuit 105 controls the address designation operation of the row decode circuit 103, various operations of the selected data transfer circuit 102, operation of the data input/output circuit 104, etc. In particular, the control circuit 105 generates a clock signal on the basis of a signal applied by a select control circuit 200 to sequentially control the data transfer by the selected data transfer circuit 102.

The select control circuit 200 is composed of a register file 201, a string data register 202, a data input/output circuit 203, and a control circuit 204. The register file 201 sequentially stores selected data that is transferred sequentially from the selected data transfer circuit 102 of the selective data memory device 100. The string data register 202 stores string data given to the selected data transfer circuit 102. The data input/output circuit 104 serves as an interface to an external bus 108. The control circuit 204 controls the register file 201, the string data register 202, the data input/output circuit 203, etc., and gives a control signal to the control circuit 105 of the selective data memory device 100. In the system described above, the select control circuit 200 gives string data to the selective data memory device 100, receives the selected data in sequence, and stores the received data in the internal register file 201. Further, where necessary, the select control circuit 200 selects the string data for the succeeding cycle from the selected data stored in the register file 201.

Figure 2:
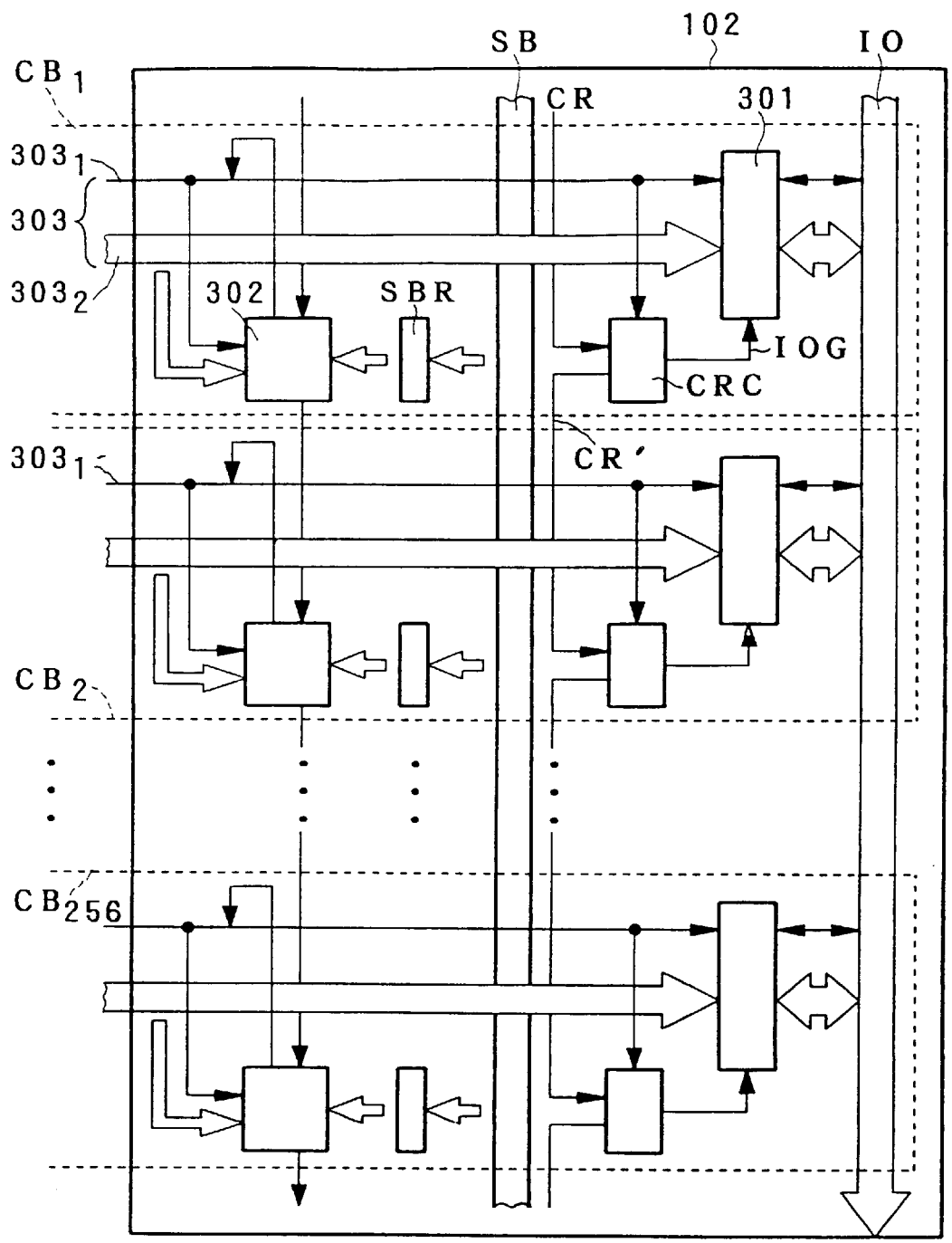
FIG. 2 is a block diagram showing a first embodiment of the selected data transfer device according to the present invention.

FIG. 2 is a circuit diagram showing the selected data transfer circuit 102. As explained, the selected data transfer circuit 102 is composed of column select units each belonging to one of the column blocks CB. Further, each column select unit or each column block is connected to an 8-bit data bus IO (an extension of the data bus 106 shown in FIG. 1) and an 8-bit string data bus SB (an extension of the data bus 107 shown in FIG. 1).

Each column block CB includes an 8-bit column data line bundle 303 connected to the memory cells. The column data line bundle 303 is composed of a 1-bit upper column data line $303_1$ and a 7-bit lower column data line bundle $303_2$. Each column block CB is further composed of a column gate circuit 301, a skip and sequential read circuit CRC, a string bit register SBR, and a bit compare mark circuit 302.

The column gate circuit 301 connects the data bus IO with the column data line bundle 303.

The skip and sequential read circuit CRC controls the column gate circuit 301 on the basis of data of the 1-bit upper column data line and a signal CR supplied by the adjacent column block on the upper side.

The string bit register SBR is composed of 8-bit register columns, and detects data on the string data bus SB and stores it temporarily.

The bit compare mark circuit 302 compares 8-bit data on the column data line bundle 303 with 8-bit string data stored in the string register SBR, and rewrites the comparison result in the column data line bundle 303. Although there are various rewrite methods, as described later, the typical methods are such that in the case of a match, an "H" data is written in the succeeding upper column data line $303_1$ (in the column block adjacent to the lower side in FIG. 1) or an "H" data is written in its own column data line $303_1$ (in the column block belonging to the column select unit). As described below, the bit compare mark circuit 302 is composed of a bit comparator BC and a string match mark circuit SMM.

Figure 3:
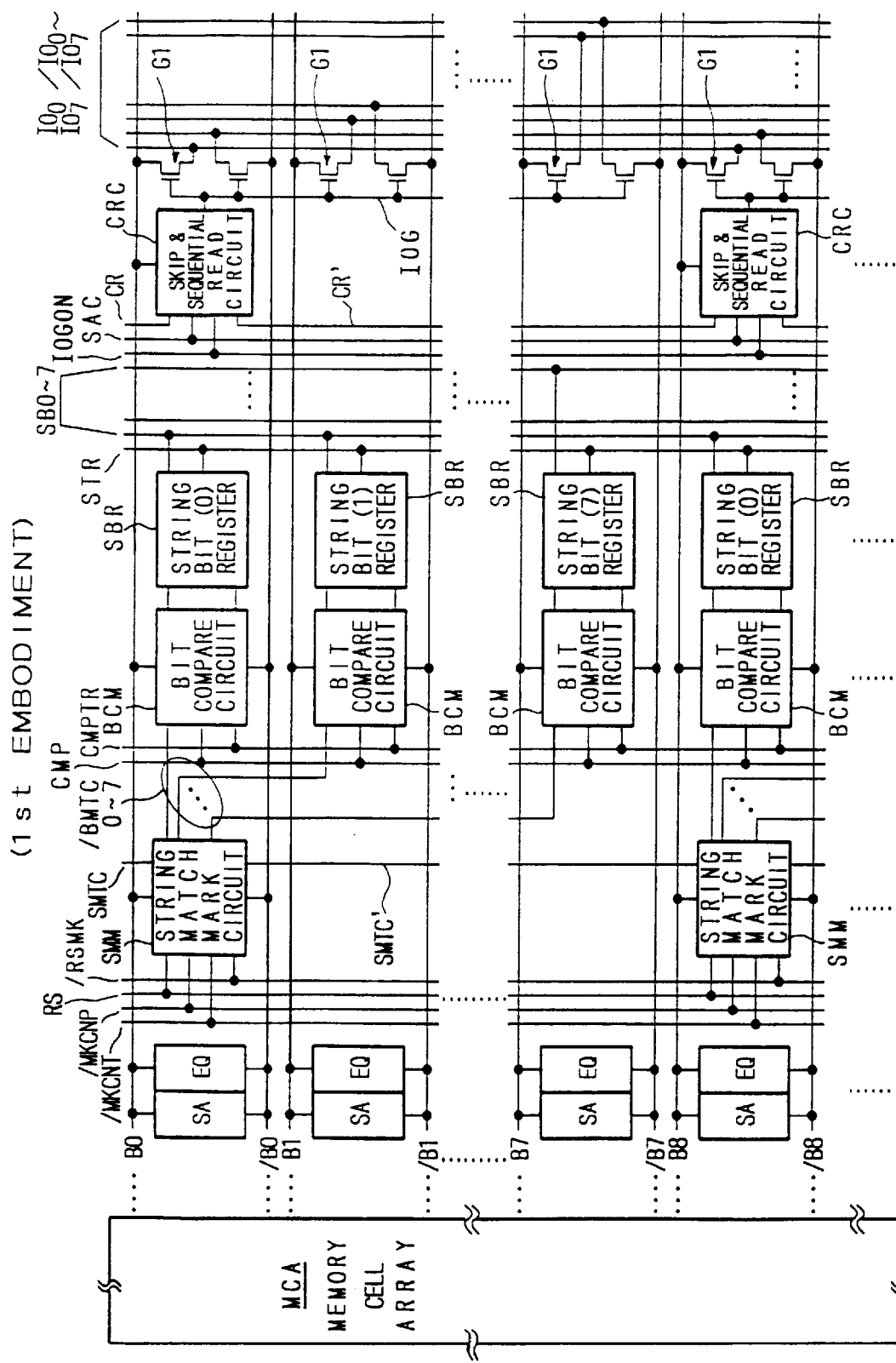
FIG. 3 is a detailed circuit diagram showing an essential portion of FIG. 2.

FIG. 3 is a block diagram showing a first embodiment of the memory device of the present invention. In FIG. 3, bit lines are composed of 8-bits from B0 to B7, each of which is paired with another bit line /B0 to /B7, respectively. In FIG. 2, the column data line bundle 303 corresponds to this 8-bit line pair; that is, the upper column data line $303_1$ corresponds to the bit line pair B0 and /B0, and the lower column data line bundle $303_2$ corresponds to the bit line pairs from B1 and /B1 to B7 and /B7. In this embodiment, the key string data are 8 bits. Further, the 8-bit data set after the 8-bit key string data are one-content data belonging to the key string. Further, the ninth bit data corresponds to the upper column data line $303_1'$ of the succeeding column data line bundle 303', and further this ninth bit data is used as an attribute bit (i.e., a mark bit) corresponding to the data of the column data line bundle 303. In FIG. 3, dynamic cells are not shown.

To each column line, a sense amplifier SA and an equalizer EQ are connected.

The I/O lines are composed of 8 bits, and IO0 and /IO0, IO1 and /IO1, . . . , IO7 and /IO7 are paired. These I/O line pairs are connected to the bit line pairs via gates G1 controlled by an IOG (input and output gate) signal. These gates constitute a column gate circuit 301. The skip and sequential read circuit CRC controllably turns on and off these gates. Further, an IOGON (IO gate ON) signal and a SAC (serial access) signal are supplied to the skip and sequential read circuits CRC. The skip and sequential read circuit CRC receives a CR signal from another skip and sequential read circuit CRC (which belongs to the upper side column block in the drawing) and transmits a CR' signal to another skip and sequential read circuit CRC' (which belongs to the lower side column block in the drawing).

The string bit register SBR is provided for each of the 8-bit line pairs B0 to B8. The key string data correspond to the 8 bits on the key string bit data lines SB0 to SB7. A STR (string transfer) signal is supplied to the string bit register SBR to transfer the key string data from the key string bit data lines SB0 to SB7.

The string bit register SBR is connected to the bit comparator BCM. A CMP (compare) signal and a CMPTR (compare data transfer) signal are applied to the bit comparator BCM.

The bit compare circuit BCM applies an inversion signal /BMTCi of BMTCi (bit match) (i=0 to 7) signal to the string match mark circuit SMM. To this string match mark circuit SMM, a SMTC (string match) signal of another string match mark circuit SMM is inputted. Further, this string match mark circuit SMM outputs a SMTC' signal to another string match mark circuit SMM. An inversion signal /RSMK of a RSMK (reset mark) signal, a RS (rest) signal, an inversion signal /MKCMP of a MKCMP (mark compare) signal, and an inversion signal /MKCNT of a MKCNT (mark content) signal are inputted to the string match mark circuit SMM. The string match mark circuits SMM are connected to each other by the SMTC' signal.

In this memory device, no column decoder is required. Further, as shown in FIG. 1, the row decoder 103 decodes addresses supplied from the inside or the outside of the memory chip and activates a word line for a row selection.

The operation of the above-mentioned memory device will be described hereinbelow.

First, data write operation in the memory cell array will be explained.

When data are written in the memory cell array, a word line is selected to connect the bit lines with the cells. After that, the I/O line pairs IO0 to IO7 and /IO0 to /IO7 are connected with the bit line pairs B0 to B7 and /B0 to /B7, respectively. In FIG. 3, since it is assumed that 8-bit data are written at the same time, 8-bit I/O pairs 0 to 7 are shown.

In the data write, data are written 8 bits by 8 bits in series to the cells belonging to the selected word line. After the word line has been activated, the IOGON signal is applied as an "H" level pulse to reset all the skip and sequential read circuits CRC. After that, the SAC signal is applied as an "H" level pulse to set the skip and sequential read circuits CRC as the select conditions. After that, the CR pulse signal is applied as a pulse. When the CR signal is at the "H" level, the IOG signal changes to the "H" level, so that the I/O line pairs are connected with the bit lines. In other words, for each CR pulse signal, the skip and sequential read circuits CRC are selected in sequence and connected with the I/O lines 8 columns by 8 columns in sequence. Under these conditions, when appropriate data are given to the I/O lines, the data can be written in the cells.

In the above-mentioned operation, when the data are written in the memory cells, the key string data are also stored as a data set.

As described above, when data are written in the memory cells, the key string data are stored simultaneously as a data set. Here, the key string data are data used as a data selecting key and are located at a head of the ordinary data structure. That is, when the column block 1 corresponds to the key string data, the column blocks 2, 3, and 4 correspond to the selected data. Further, when the column block 5 corresponds to the key string data, the column blocks 6, 7 and 8 correspond to the selected data.

The data selection will be described hereinbelow. In the data write, the key string data have been already stored in the memory cells as a data set. The preparation operation for selecting and reading the key string data will be first explained.

First, the STR signal is set at the "H" level to open the string bit registers SBR corresponding to the string bits 0 to 7. Under these conditions, key string data to be selected are applied to the string bit data lines SB0 to SB7. As a result, the key string data are written in the string bit registers SBR. The string bit registers SBR are constructed by an 8-bit unit, in this case, and the same key string data are written in all the 8-bit string bit registers SBR.

As the selection is effected row-by-row in the cell array, when the DRAM cell array is used as the memory cell array as shown in FIG. 3, the data selection can be executed together with the cell data refresh. The operation sequence is as follows: in the same way as in the conventional DRAM, a row is first selected to activate the word line, and the cell data are sensed by the sense amplifiers SA. After that, the data transferred to the bit lines Bi and /Bi are applied to the bit comparators BCM by setting a CMPTR pulse signal at the "H" level in pulse state. After that, the CMP signal is set at "H" level to compare the data transferred to the column bit lines with the respective bit data written in the string bit registers SBR. When the compared data match, the /BMTCi signal of the bit comparators BCM change to the "L" level. When all the 8-bit string data match, the SMTC signal of the string match mark circuit SMM changes to the "H" level. This signal SMTC is supplied to the succeeding string match mark circuit SMM as the SMTC' signal.

Here, the operation can be divided into two types according to how to process the matched selection results. First, the selection of data belonging to the key string data will be explained, and after that the selection of columns of key string data will be explained.

(1) Selection of Data Belonging to Key String Data

When data which match the key string data are found as a result of data selection, it is understood that 8 bits adjacent to the matched key string data are the data belonging thereto. In this case, it is necessary to attach marks to the data. In this embodiment, the mark bit is the 0-th bit of the 8-bit unit. Therefore, if the first 8-bit (0 to 7) as shown in FIG. 2 match the matched key string data, the SMTC' signal changes to the "H" level, and is then applied to the string match mark circuit SMM of the column of B8 and /B8 in FIG. 3. Here, when the /MKCNT signal is set at the "L" level, "1" can be written in the B8-/B8 column. The write of "1" as described above is executed simultaneously for all the match string data of the selected and activated rows.

(2-1) Selection of Columns Having Key String Data (mark setting)

To rewrite a part of the key string data or to change or rewrite the matched data set themselves, it is necessary to mark the columns having the matched key string data. In this case, the string match mark circuit SMM writes the mark "1" in the 0-th bit of the matched 8-bits on the basis of the SMTC' signal formed for itself. For doing this, the /MKCMP signal is set at the "L" level, instead of the /MKCNT signal.

(2-2) Selection of Columns Having Key String Data (mark resetting)

Further, the 0-th bit of "1" is sometimes used for the key string data themselves. In that case, as a matched string data, this mark is sometimes required to be reset. Therefore, the /RSMK signal is used to reset the "1" 0-th bit. That is, when this /RSMK signal is set at the "L" level, the string match mark circuit SMM writes "0" in the 0-th bit of the string data, if the SMTC' signal formed for itself is at the "H" level.

By repeating the above-mentioned operation during refresh for each row, it is possible to execute the selection of all the cells simultaneously with the refresh. Further, the selected string data are marked by setting the 0-th bit thereof to "1", or resetting it to "0".

As described above, two processing methods have been explained with respect to the match selection result. Now, the access to the selected string data will be explained.

The string data whose 0-th bit is marked with "1" are accessed. There exist a plurality of marked string data in the selected row.

The access is made skippingly and sequentially to these marked string data. During the access, it is not clear as to whether there the marked string data in a row. First, any desired row is selected and activated. Then, in order to read the 0-th bits of the string data of the respective sensed columns to the skip and sequential read circuits CRC, the IOGON signal is applied as the "H" level pulse. After that, the IOGON signal is set to "L" level, and the CR signal is toggled in the same way as in the ordinary DRAM page mode access. As a result, during the first "H" level of the CR signal, the 8-bits of the first marked string data in the selected row are connected to the I/O lines.

Further, when the CR signal is kept toggled, the marked string data can be accessed in sequence, so that the string data can be read and written.

When no string data exists in the selected row, or after the finally marked string data has been accessed, if the CR signal changes to "H" level, the CRL signal changes to "H" level. This signal indicates that the string data to be accessed no longer exists in this row.

The same operation as above is executed to the respective rows in order to access all the marked string data. Therefore, it is possible to execute the refresh operation and the access operation simultaneously by repeating the similar access operation to all the rows of the memory.

The write of the key string data and data set, the string data selection, and the access to the marked string data have been described by taking the case where the DRAM is used. However, the above-mentioned construction of the present invention can be of course applied to random access memories such as SRAMs, without being limited to only DRAMs. Further, the above-mentioned construction is well suitable to the NAND type EEPROM. This is because the NAND type EEPROM is provided with a data latching sense amplifier for each column and the circuit construction thereof is quite the same as the above-mentioned construction shown in FIG. 3 (except for the equalize circuits EQ). When used as the data selection in a Chinese letter ROM, it may be necessary to use the ROM cell array as the memory cell array.

The respective elements of the circuit shown in FIG. 3 will be now explained in further detail.

Figure 4:
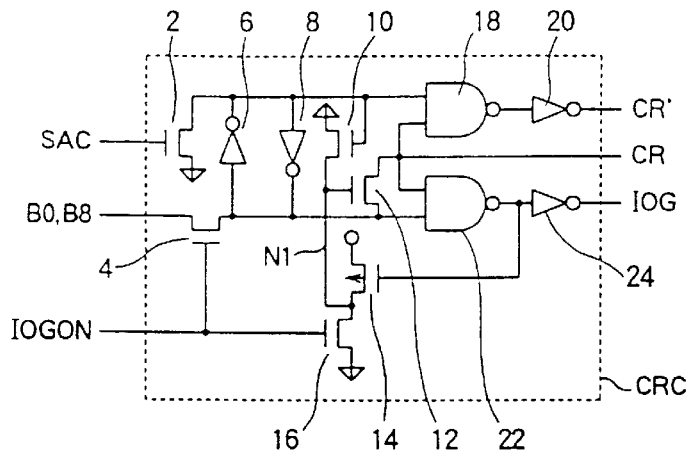
FIG. 4 is a detailed circuit diagram showing the skip and sequential read circuit shown in FIG. 3.

FIG. 4 is a detailed block diagram showing the skip and sequential read circuit CRC. As shown in FIG. 4, the data B0 or B8 connected with the bit line is inputted via an N-channel MOS transistor 4, and further supplied to an input side of an inverter 6, an output side of an inverter 8, a NAND circuit 22, and a drain of an N-channel MOS transistor 12. The IOGON signal is applied to the gates of the transistor 4 and an N-channel MOS transistor 16. The SAC signal is inputted to the gate of an N-channel MOS transistor 2. The drain of the transistor 2 is connected to the output side of the inverter 6, the input side of the inverter 8, the gate of an N-channel MOS transistor 10, and a NAND circuit 18. The CR signal is supplied to the NAND circuits 18 and 22 and the source of the transistor 12. The drain of the transistor 16 is connected to the drain of a P-channel MOS transistor 14, the gate of the transistor 12, and the drain of the transistor 10. The output of the NAND circuit 22 is supplied to the gate of the transistor 14 and an inverter 24. Further, the output of the NAND circuit 18 is supplied to an inverter 20. The inverter 20 outputs the CR' signal, and the inverter 24 outputs the IOG signal. The sources of the transistors 2, 10 and 16 are all grounded, and the source of the transistor 14 is connected with a voltage supply.

In the circuit as described above, the data B0 or B8 is a bit changed to the "H" level when the bit line corresponding to the 0-th bit of the string data shown in FIG. 3 is marked. The level of the bit line is read to this circuit via the transistor 4 when the IOGON signal is at the "H" level. After this bit line level has been read, the bit line is separated from this skip and sequential read circuit CRC. Here, if the SAC signal changed to the "H" level, the skip and sequential read circuit CRC is set to the state that would be obtained when the bit line was at the "H" level, irrespective of the bit line level.

First, the "H" level CR signal is assumed to be inputted to the skip and sequential read circuit CRC. At this time, if the level of the read bit line is at the "L" level, the change of the CR signal is outputted via the NAND circuit 18 and the inverter 20, as the CR' signal. If the level of the read bit line is at the "H" level during the period of the "H" level CR signal, the IOG signal changes to the "H" level via the NAND circuit 22 and the inverter 24. Further, a node N1 changes to the "H" level via the transistor 14.

Then, if the CR signal changes to the "L" level, the IOG signal changes to the "L" level by resetting the "H" level of the read bit line. Accordingly, after that, even if the CR signal changes to the "H" level, the skip and sequential read circuit CRC keeps outputting the "H" level CR' signal.

Figure 5:
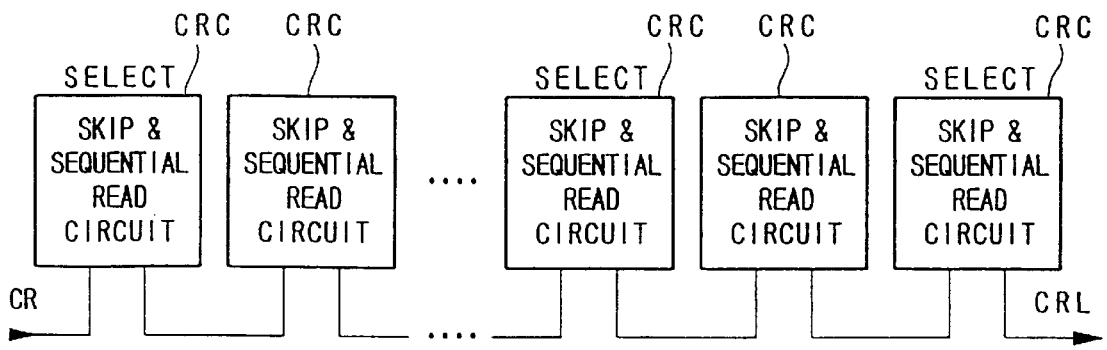
FIG. 5 is a block diagram showing the interconnection between the skip and sequential read circuits.

The skip and sequential read circuits CRC are connected in series along the row of the cell array, as shown in FIG. 5.

Here, the assumption is made that the bit lines of the skip and sequential read circuits CRC shown by [SELECT], [SELECT'] and [SELECT"] are at the "H" level and this "H" level is read. In this case, the IOG signal of [SELECT] rises in response to the first CR signal, the IOG signal of [SELECT'] rises in response to the second CR signal, and the IOG signal of [SELECT"] rises in response to the third CR signal.

The above-mentioned operation is shown by a timing chart in FIG. 6. In FIG. 6, CR shows the CR signal; IOGON shows the IOGON signal; N1 shows the status of the node N1; N1' shows the status of the node N1'; and N1" shows the status of the node N1". In this connection, the nodes N1, N1' and N1" denote the same nodes of the different skip and sequential read circuits CRC. That is, the node N1 is the node N1 of [SELECT] CRC; the node N1' is the node N1 of [SELECT'] CRC; and the node N1" is the node N1 of [SELECT"] CRC.

First, at time t1, the IOGON signal is set to the "H" level in order to read the bit line level to the skip and sequential read circuit CRC, as explained. After that, the CR signal is toggled at time t2, time t3, time t4, . . . in sequence, to change the node N1, node N1' node N1" to the "H" level in sequence.

Further, in the circuit shown in FIG. 5, after the IOG signals of all the skip and sequential read circuits CRC have risen and there exists no IOG signal to rise in response to the succeeding CR signal pulse, the final skip and sequential read circuit CRC outputs a CRL signal in synchronism with the CR signal, so that it is possible to check that all the corresponding IOG signals have been selected.

The operation of the skip and sequential read circuit CRC has been explained roughly with reference to FIGS. 5 and 6. Here, the operation of the skip and sequential read circuit CRC will be explained more practically in detail with reference to FIGS. 7 and 8.

As shown in FIG. 7, the operation of the skip and sequential read circuit CRC is determined on the basis of the data holding conditions of two inverters 6 and 8. Here, (assuming that the state is "1" when the output of the inverter 8 is at the "H" level and "0" when the output of the inverter 8 is at the "L" level), in the case of the state "1", the output CR' is fixed to the "L" level, and the other output of the IOG is in phase with the input CR. Further, in the case of the state "0", the output CR' is in phase with the input CR, and the other output IOG is fixed to the "L" level. FIGS. 7(a) and 7(b) show these levels schematically.

Figure 8:
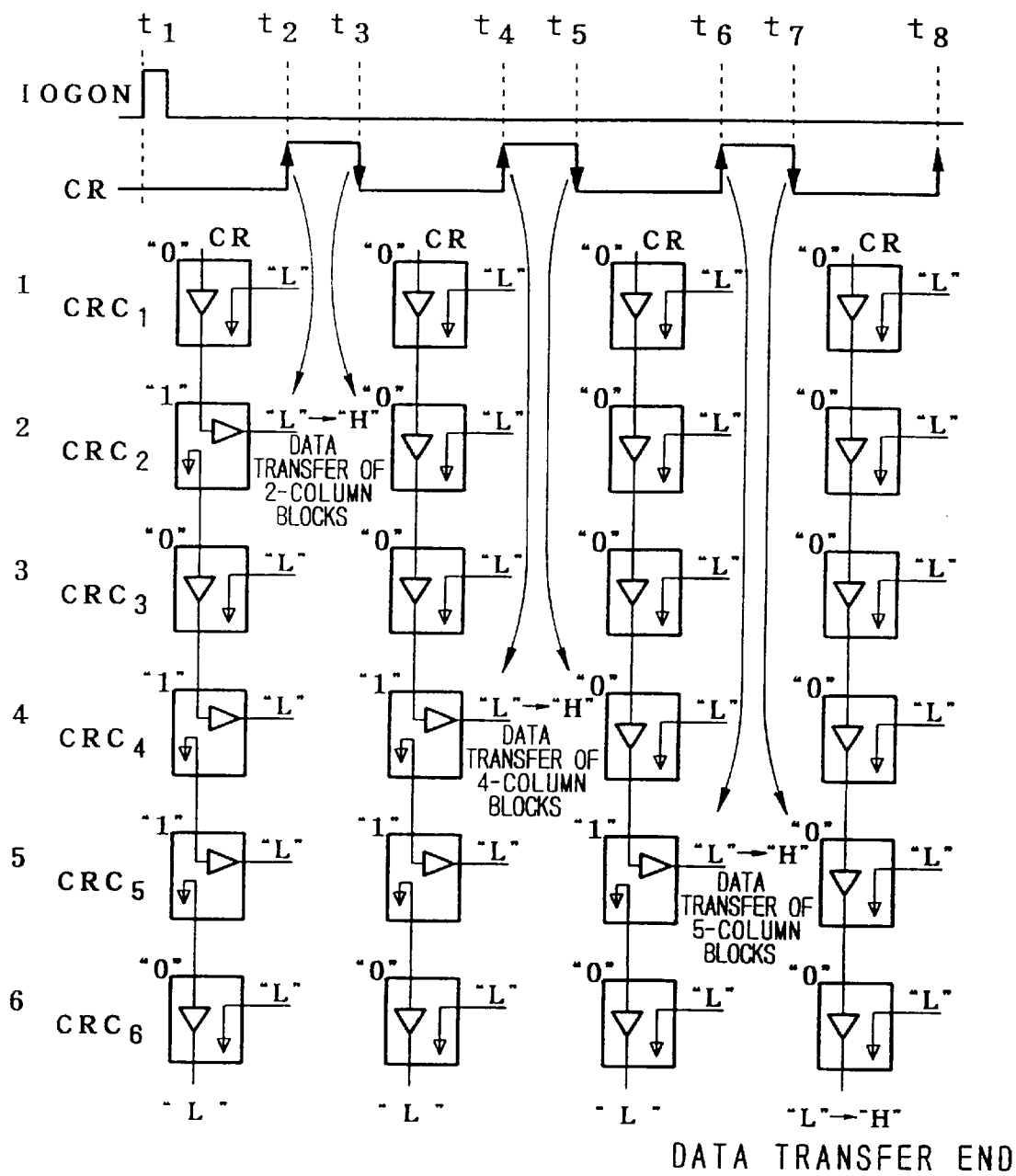
FIG. 8 is a block diagram explaining the operation of the skip and sequential read circuit.

FIG. 8 is an illustration explaining the operation of the skip and sequential read circuit CRC in the case of a memory cell array composed of 6 column blocks. At time t1, since the "H" level pulse of the IOGON is inputted to all the skip and sequential read circuits CRC, data are transferred from the bit lines. As a result, the circuits CRC2, CRC4 and CRC5 are set to the "1" level and other circuits CRC are set to the "0" level. Accordingly, the skip and sequential read circuit is 010110 from the upper side. At this time, only the output IOG of the circuit CRC2 is driven in phase with the input CR, and the other outputs IOG of the circuits CRC are fixed to the "L" level. Successively, at time t2, when the input CR rises from "L" to "H", since the output IOG of the circuit CRC2 rises to "H" level, data of the second column block are transferred. Further, at time t3, when the input CR falls, the circuit CRC2 changes from "1" to "0". As a result, the skip and sequential read circuit is 000110 from the upper side. At this time, only the output IOG of the circuit CRC4 is driven in phase with the input CR, and the other outputs IOG of the circuits CRC are fixed to the "L" level.

Successively, at time t4, when the input CR rises from "L" to "H", the output IOG of the circuit CRC4 rises to "H" level. As a result, data of the fourth column block are transferred. Successively, at time t5, when the input CR falls, the circuit CRC4 changes from "1" to "0". As a result, the skip and sequential read circuit is 000010 from the upper side. At this time, only the output IOG of the circuit CRC5 is driven in phase with the input CR, and the other outputs IOG of the circuits CRC are fixed to the "L" level. Successively, at time t6, when the input CR rises from "L" to "H", the output IOG of the circuit CRC5 rises to "H" level. As a result, data of the fifth column block are transferred. Successively, at time t6, when the input CR falls, the circuit CRC5 changes from "1" to "0". As a result, the skip and sequential read circuit is 000000 from the upper side. Successively, at time t8, when the input CR rises from "L" to "H", the output CR' of the circuit CRC6 first changes to "H" level. As a result, it is possible to confirm that all the data (whose corresponding key string data match and marked) have been transferred.

As explained above with reference to FIGS. 7 and 8, it is possible to read only the data of the marked column blocks, without reading data from the non-marked column blocks, so that an extremely high data transfer can be realized. For instance, if there are 256 column blocks and three column blocks are marked, only three data transfers are executed, without need of transferring data 256 times as in the case of the prior art memory device. Further, when all the marked data have been outputted, the end of data transfer can be detected on the basis of the output CR' of the skip and sequential read circuit CRC in the final column block. This output signal CR' can be outputted from the selective data memory device 100 by releasing the control circuit 105 shown in FIG. 1. In more detail, the signal CR' is transferred to the peripheral circuit 200.

Figure 9:
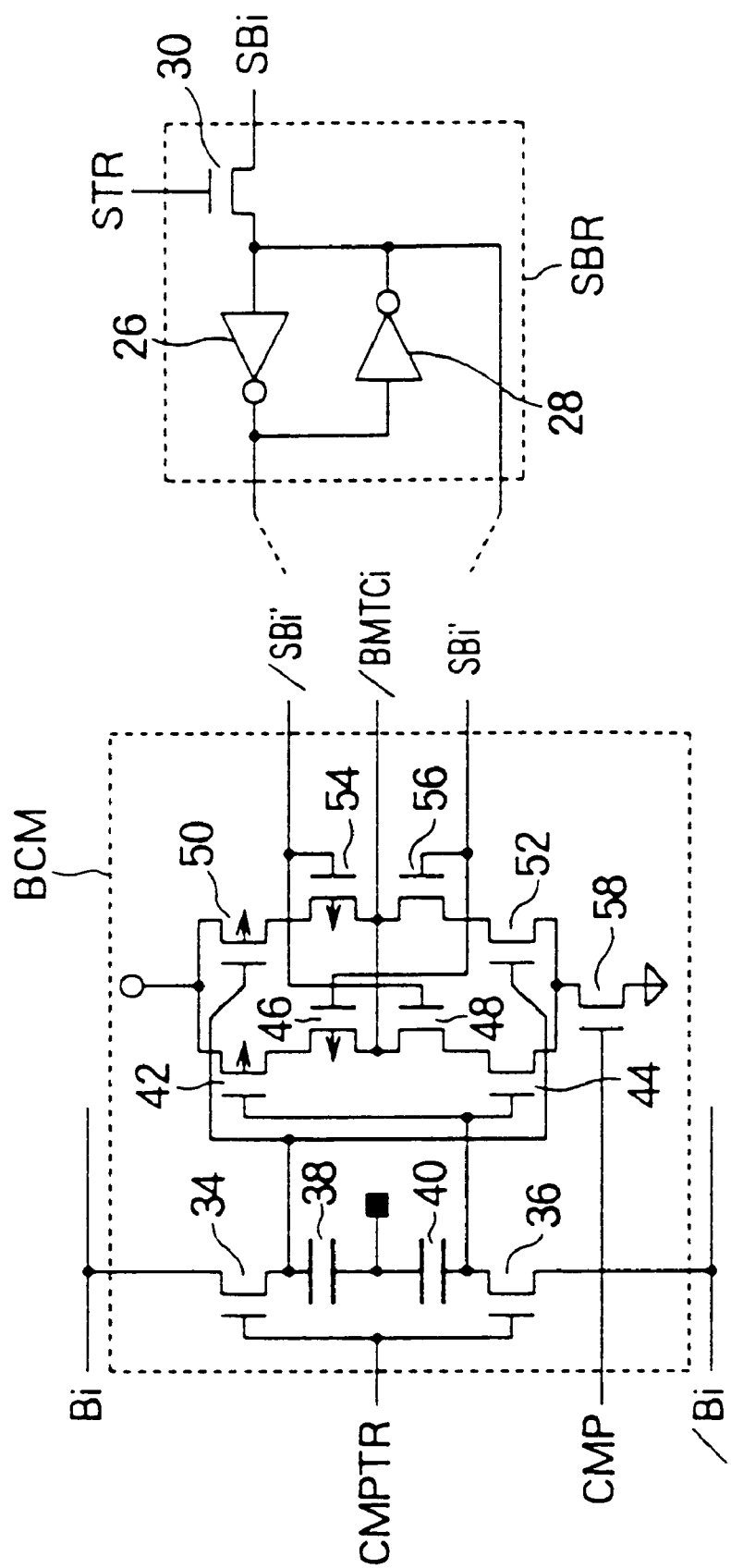
FIG. 9 is a detailed circuit diagram showing a string bit register and a bit comparator.

FIG. 9 shows practical circuits of the bit comparator BCM and the string bit register SBR.

As shown in FIG. 9, the string bit register SBR is composed of two inverters connected opposite in parallel to each other so as to constitute a self-holding system, and an N-channel MOS transistor 30 to which the string bit SBi is inputted. The STR signal is inputted to the gate of the transistor 30. Further, the inverter 28 outputs the string bit SBi', and the inverter 26 outputs the complementary string bit /SBi. Both the output string bits are applied to the bit comparator BCM.

In the bit comparator BCM, the string bit SBi' is inputted to the gates of an N-channel MOS transistor 56 and a P-channel MOS transistor 46. Further, the string bit /SBi is inputted to the gates of a P-channel MOS transistor 54 and an N-channel MOS transistor 48. The drains of the transistors 54, 46, 56 and 48 are connected to each other in common to output the /BMTCi signal. The bit line Bi is connected to the source of an N-channel MOS transistor 34, and the bit line /Bi is connected to the source of an N-channel MOS transistor 36. The CMPTR signal is applied to the gates of the transistors 34 and 36. The drain of the transistor 34 is connected to the gates of a P-channel MOS transistor 50 and an N-channel MOS transistor 52. On the other hand, the drain of the transistor 36 is connected to the gates of a P-channel MOS transistor 42 and an N-channel MOS transistor 44. The drain of the transistor 50 is connected to the source of the transistor 54; the drain of the transistor 42 is connected to the source of the transistor 46; the drain of the transistor 52 is connected to the source of the transistor 56; and the drain of the transistor 44 is connected to the source of the transistor 48. A capacitor 38 is connected to the drain of the transistor 34, and a capacitor 40 is connected to the drain of the transistor 36. The sources of these transistors 42 and 50 are connected to a voltage supply. The sources of the transistors 44 and 52 are connected to the drain of an N-channel MOS transistor 58. The CMP signal is given to the gate of the transistor 58. The source of the transistor 58 is grounded.

The string bit register SBR is a latch circuit. This string bit register SBR reads data from the string bit SBi when the STR signal inputted to the gate of the transistor 30 is at the "H" level, and holds the read data using the two inverters 26 and 28.

The bit comparator BCM compares the output SBi or /SBi of the string bit register SBR with the data Bi or /Bi read from the cells and amplified on the bit line. The bit comparator BCM reads data from the bit line, and compares the two data after having been disconnected from the bit line. This is because if there exist columns marked to rewrite data according to the comparison result, it is necessary to prevent the process of comparison from interfering with the changed bit line data.

The bit line data can be read by setting the CMPTR signal to the "H" level. The bit line data are read through the transistors 34 and 36, and then held at the capacitors 38 and 40. After the CMPTR signal has been set to the "L" level, when the CMP signal is changed to the "H" level, the transistor 58 is turned on. As a result, the transistors 42, 46, 50, 54, 44, 52, 48 and 56 perform the above-mentioned comparison operation. The compared result is outputted as the "L" level /BMTCi signal in the case of a match and the "H" level /BMTCi signal in the case of no match.

Figure 10:
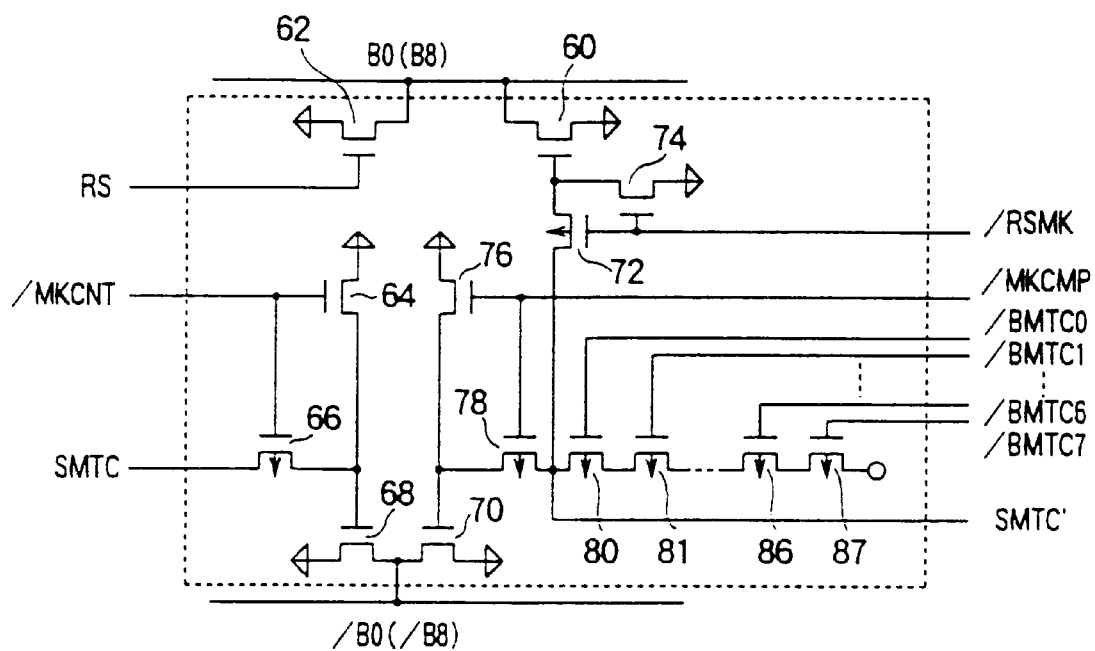
FIG. 10 is a detailed circuit diagram showing a string match mark circuit.

The string match mark circuit SMM detects the match and mismatch of the string data on the basis of the comparison result of the bit comparator BCM, and writes the mark bit. FIG. 10 is a detailed circuit diagram showing the string match mark circuit SMM.

In FIG. 10, the drains of N-channel MOS transistors 62 and 60 are connected to the bit line B0 (B8), and the sources thereof are grounded. The drains of N-channel MOS transistors 68 and 70 are connected to the bit line /B0 (/B8), and the sources thereof are grounded. The RS signal is applied to the gate of the transistor 62. The /MKCNT signal is inputted to the gates of an N-channel MOS transistor 64 and a P-channel MOS transistor 66. The SMTC signal is applied to the source of the transistor 66. The drains of the transistors 64 and 66 are connected to the gate of the transistor 68. The source of the transistor 64 is grounded. The /RSMK signal is inputted to the gates of a P-channel MOS transistor 72 and an N-channel MOS transistor 74. The source of the transistor 74 is grounded, and the drain thereof is connected to the gate of the transistor 60 and the source of the transistor 72. The /MKCMP signal is applied to the gates of an N-channel MOS transistor 76 and a P-channel MOS transistor 78. The source of the transistor 76 is grounded, and the drain thereof is connected to the gate of the transistor 70 and the drain of the transistor 78. The /BMTCi signals (i=0 to 7) are inputted to the gates of P-channel MOS transistors 80, 81, ... , 86, and 87. The source of the transistor 87 is connected to a voltage supply. The drain of the transistor 80 is connected to the drain of the transistor 72 and the source of the transistor 78 to output the SMTC' signal.

In the circuit configuration as described above, the /BMTCi signal is a comparison result of the bit comparator BCM for one of the 8 columns for constituting a string data. When the string matches, since the levels of all the /BMTCi signals are set at the "L" level, the SMTC' signal changes to the "H" level.

The SMTC signal is a similar signal outputted by the string match mark circuit SMM adjacent to the string data belonging to this string match mark circuit SMM.

As explained, when the compared string itself is marked, the /MKCMP signal is set at the "L" level. In this case, if the SMTC' signal is at the "H" level, since the /B0 signal becomes the "L" level via transistor 70, "1" is written in the 0-th bit of the string data itself. On the other hand, when the data belonging to the compared string is marked as the selected data, the /MKCNT signal is set at the "L" level. If the SMTC signal is at the "H" level, "1" is written to the 0-th bit of the succeeding string data after the compared string data via transistor 68.

Further, when the RS signal is set at the "HI" level in common for all the string match circuits SMM, it is possible to write "0" to the 0-th bit of all the string data. This function is necessary to reset all the marks of the new key string data, before match selection.

The string match circuit SMM is also provided with a circuit for resetting a mark of the matched string data. When the /RSMK signal is set to the "L" level, as far as the compared string matches and thereby the SMTC' signal is at the "H" level, "0" is written in the 0-th bit of the compared string data to reset the mark thereof.

This resetting method is effective when the final string data is accessed in the sequential selection of the string data of tree structure. Further, this method is effective to access an independent data in the tree structure, for instance as when data D is accessed from the data B in such a tree structure that A→B→C and B→D. That is, data are selected by A to mark B under A; data are then selected by non-marked B to mark D; and further data are selected by marked B to reset the mark of itself. Then, the marked data are only D, so that only the data D can be read or written.

Further, in the data structure of A→A→B, when data are selected with A as the key string data, the second A and B are both marked. In this case, after data have been selected by marked A, only B can be accessed when the mark of the A itself is reset and only B remains marked.

The circuit structure of a second embodiment of the selective data memory device according to the present invention will now be described with reference to FIGS. 11 to 14. The schematic construction shown in FIGS. 1 and 2 can be applied to the design of this second embodiment in the same way as in the first embodiment, so that the disclosure thereof is omitted herein.

Figure 11:
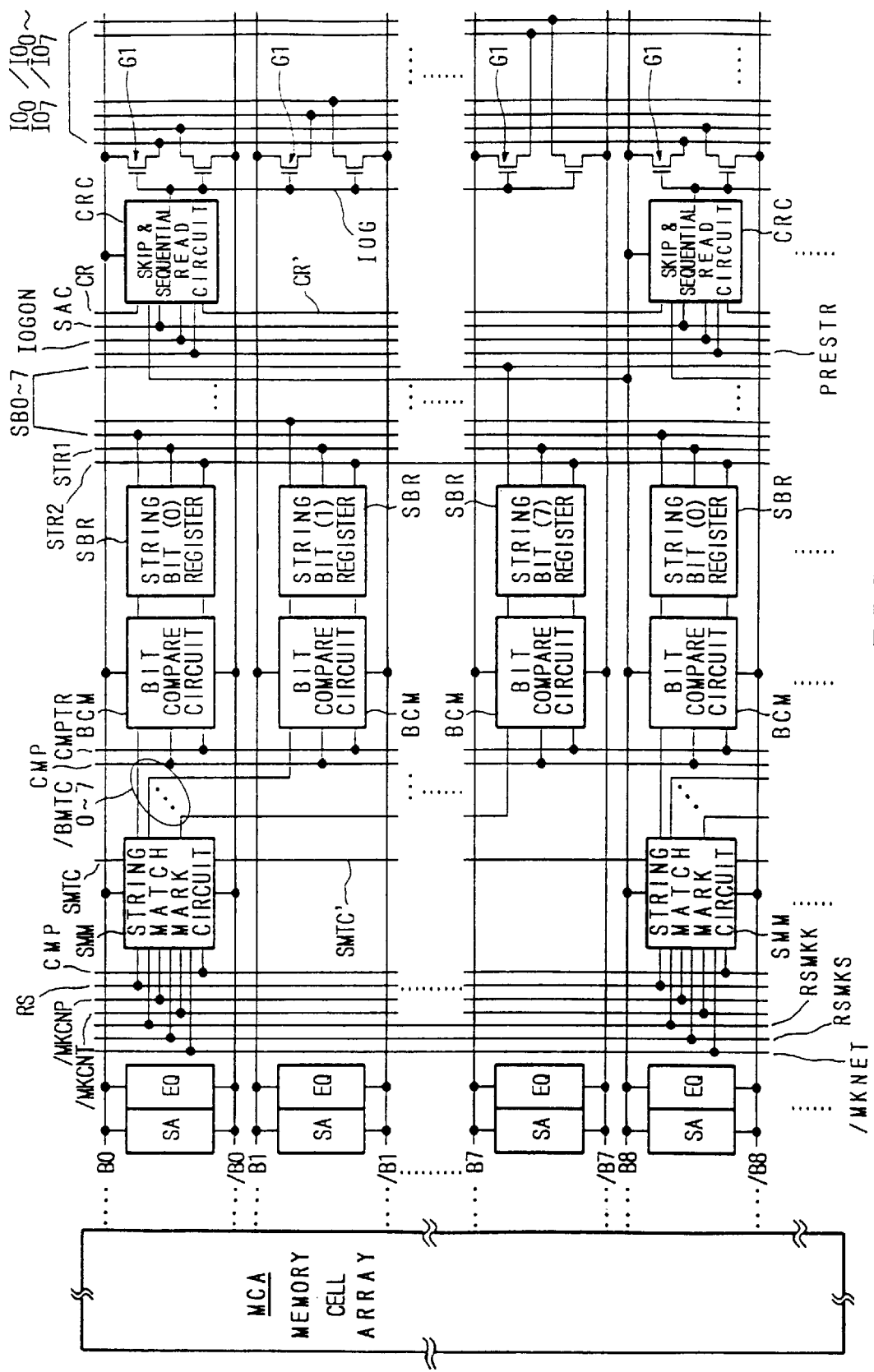
FIG. 11 is a circuit diagram showing a second embodiment of the present invention.

As shown in FIG. 11, in the second embodiment, the constructions of the skip and sequential read circuits CRC, the string bit registers SBR and the string match mark circuits SMM are modified, in comparison with the corresponding elements of the first embodiment. Further, some control signal lines are additionally provided.

The skip and sequential read circuits CRC are connected to the column data line B8 (i.e., B0') which belongs to the adjacent lower column blocks, and further a PRESTR signal is inputted thereto.

In the first embodiment, the STR signal is inputted to the string bit registers SBR. In this embodiment, two types of signals STR1 and STR2 are inputted thereto.

In comparison with the four input signals of the first embodiment, in the second embodiment, four new signals CMP, RSMKK, RSMKS, and /MKNXT are inputted to the string match mark circuit SMM, while the RSMK input signal is omitted.

Figure 12:
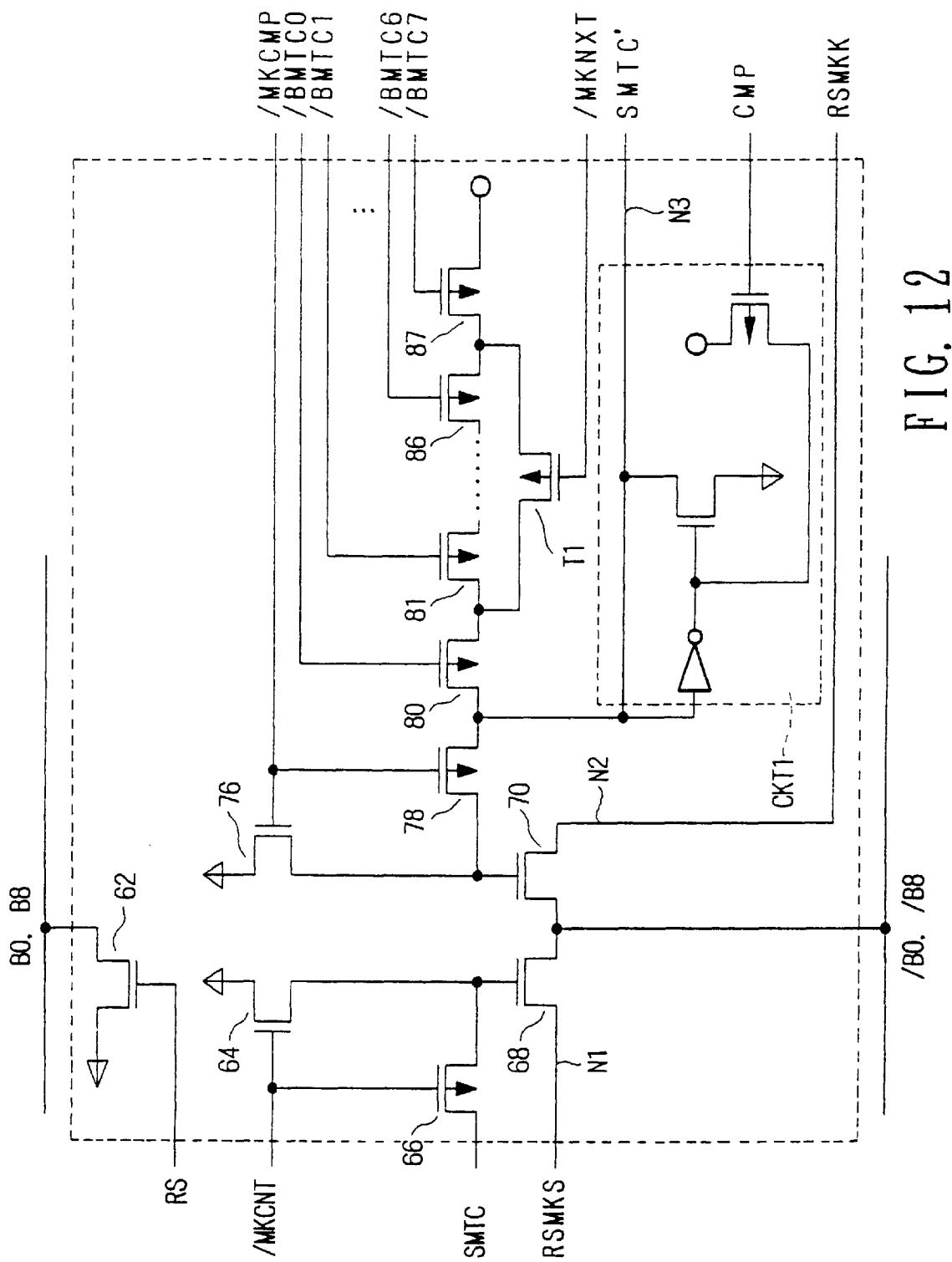
FIG. 12 is a detailed circuit diagram showing a string match circuit related to the second embodiment.

FIG. 12 shows the circuit construction of the string match mark circuit of the second embodiment, which is obtained by modifying the circuit shown in FIG. 10 to realize the following three functions.

During "selection of data belonging to the key string data" as explained in Item (1) above, in order to reset the mark of adjacent 8-bit data, the signal RSMKS is applied to a node N1 of a transistor 68 (this node N1 is grounded in FIG. 10). Therefore, if the signal RSMKS is at "0", "1" is written in the mark bit. Further, in order to simplify the reset circuits of the mark of the key string itself as stated in Items (2-1) and (2-2) above, the signal RSMKK is applied to a node N2 of a transistor 70 (this node N2 is grounded in FIG. 10). Therefore, if the signal RSMKK is at "1", "0" is written for resetting, so that the transistors 60, 72 and 74 shown in FIG. 10 can be omitted and no signal /RSMK is required.

Further, in order to set "0" or "1" to the mark bit of the string after the string whose mark bit is "1", a new transistor T1 and the signal /MKNXT are additionally provided. This transistor T1 bypasses the transistors 81 to 87 shown in FIG. 10. If the signal /BMTCO and the signal /MKNXYT are both "0", the signal SMTC' is set to "1"; that is, the string having a mark bit of "1" can set a mark to the succeeding string, irrespective of the key string contents. The contents which can be set at this time are dependent upon the levels of the signal RSMKS and RSMKK. With combinations of these signal levels, the transistor 62 and the signal RS may be omitted. In other words, instead of the mark reset operation, when the mark bit is "1", data are selected by the signal /MKNXT of "0", the signal /MKCMP of "0" and the signals RSMKK and RSMKS of "1". Here, if the signal /MKCNT is "1", the signal RSMKS of "0" can be used.

Further, a circuit CKT1 shown in FIG. 12 is controlled by a new signal CMP, to which the signal SMTC' is applied. This circuit CKT1 is a "0" latch circuit for preventing the signal node N3 from floating at "0". The signal CMP is a "0" pulse signal of the signal CMPTR, so that the node N3 is reset at "0" at the time data are transferred from the bit lines to the string match mark circuit SMM.

The circuit construction of the string bit registers SBR of the second embodiment will now be described in detail.

In the circuits shown in FIG. 9, the key string match is discriminated for all the bits for constituting the string. Further, when all the bits match, the string match is decided as being matched. In the actual selection, there exists a case where the data are required to be selected by neglecting a part of the string. For this purpose, in FIG. 13(*a*), the bit register is modified such that even when a part of the bits match, the string bit match can be established.

In FIG. 9, the signals /SBi' and SBi' are formed by the single latch circuit constructed by the inverters 26 and 28. In contrast with this, in FIG. 13, two latch circuits LCH1 and LCH2 are provided for both the signals /SBi' and SBi, respectively. Further, the control signals STR1 and STR2 for the transfer gates TG1 and TG2 which detect data from the data lines SBi are separated from each other. In the comparison bits at which the read data are ignored, as far as both the data lines /SBi' and SBi' are "1", the signal /BMTCi is "0", irrespective of data of Bi and /Bi. In other words, the results are the same as when the data match at these bits. Therefore, the latched data are controlled on the basis of three values in practice.

This function can be used as the function of the signal /MKNXT of the string match mark circuit SMM. That is, it is possible to organize the string registers disregarding the bits other than the mark bits.

Figure 13:
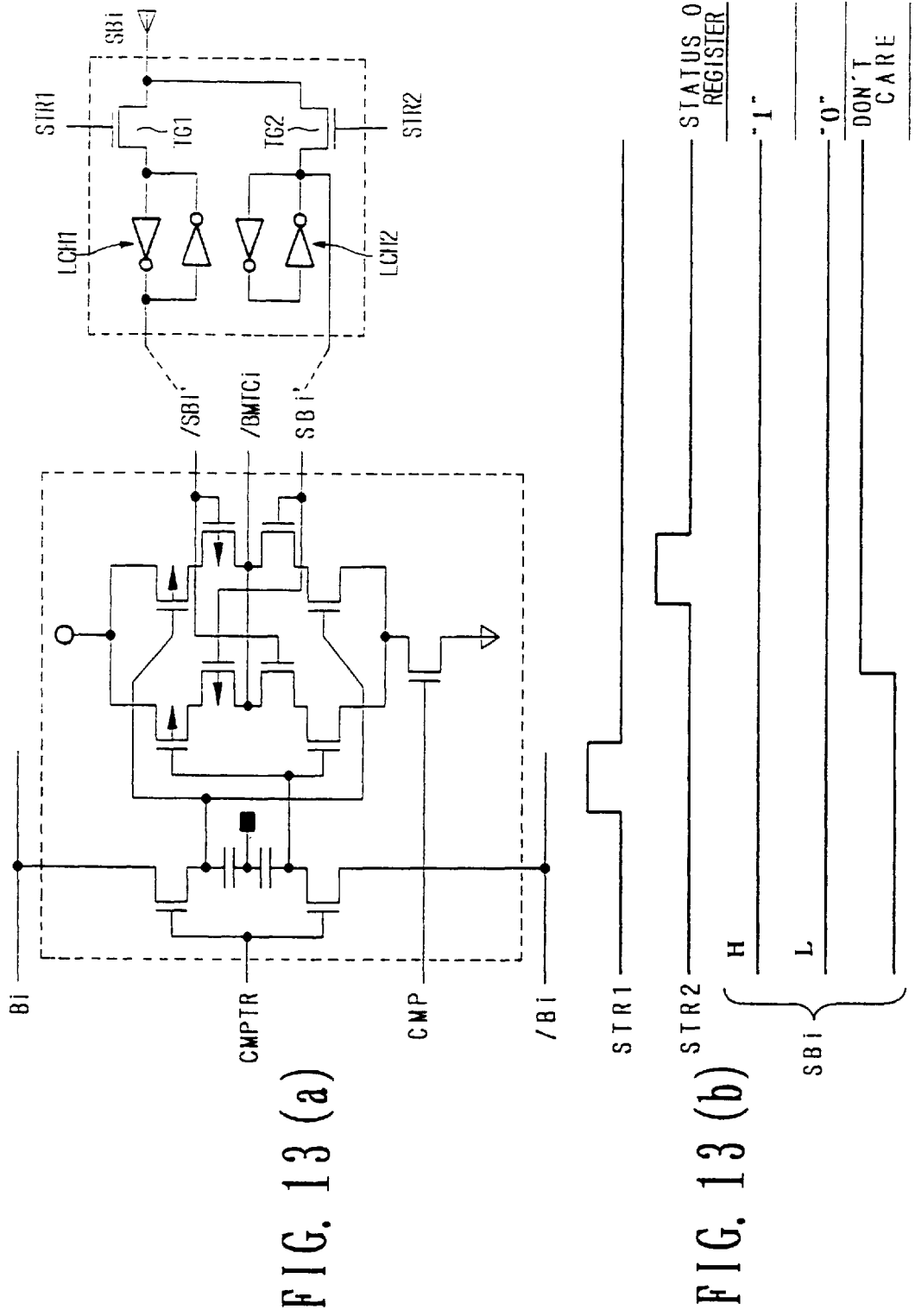
FIG. 13(a) is a detailed circuit diagram showing a string bit register and a bit comparator related to the second embodiment of the present invention.
FIG. 13(b) is a timing chart showing the operation of the circuit shown in FIG. 13(a)

FIG. 13(*b*) shows the timing of the transfer signals STR1 and STR2 and the string bit data. On the right side, the state of the string bit registers to be matched with Bi are shown.

Figure 14:
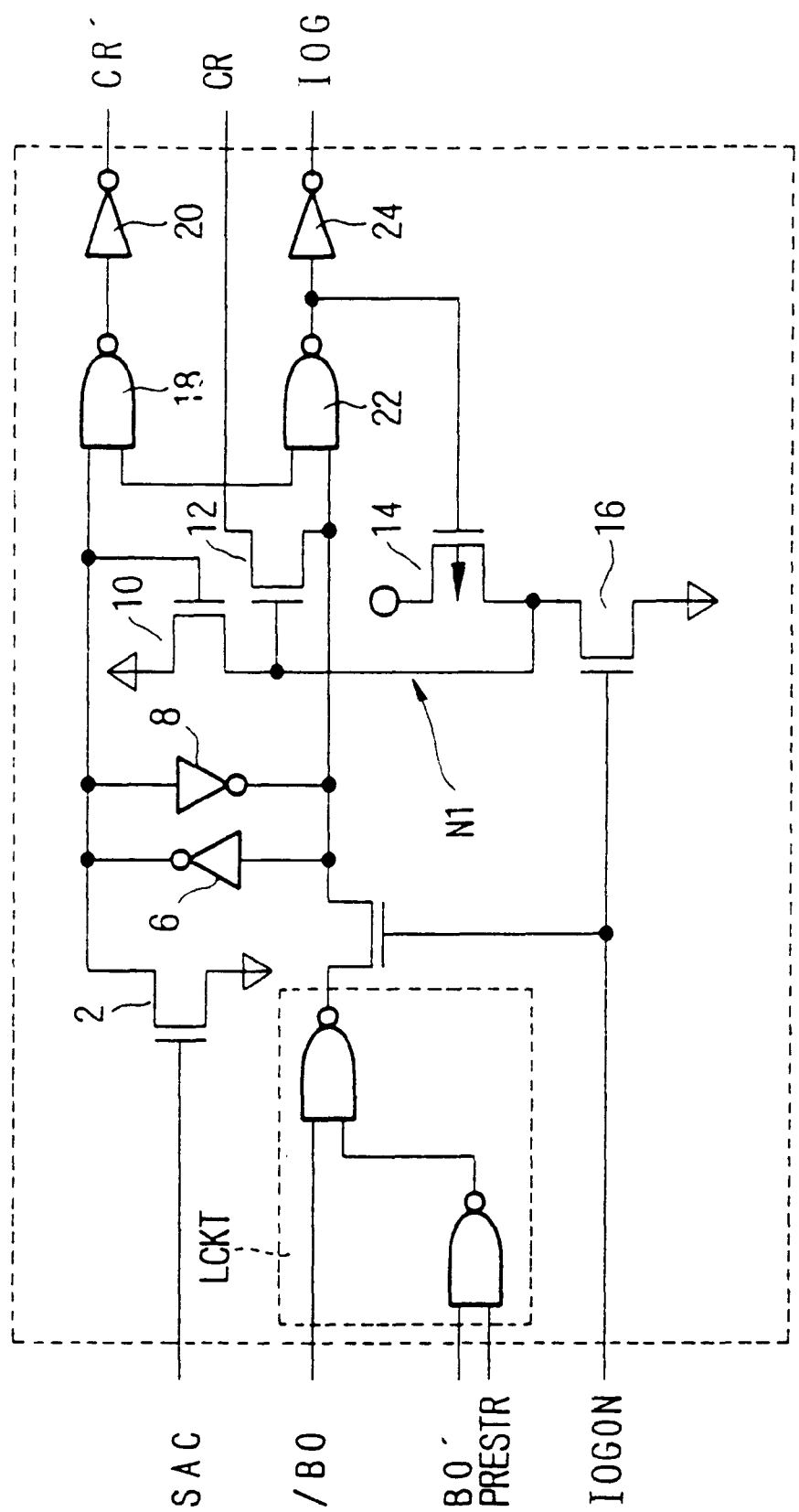
FIG. 14 is a detailed circuit diagram showing a skip and sequential read circuit related to the second embodiment of the present invention.

The skip and sequential read circuits CRC will be explained with reference to FIG. 14.

As described above, the mark bits are written in the key string itself or the succeeding key string in a one-directional way. The string which can be read by the skip and sequential read circuit CRC is only the data at the mark bit of which "1" is set. Therefore, it is impossible to read and check the contents of the string data before the string which matches a given string. This implies that the string can be selected and checked only in the preceding direction, so that it is not convenient when the state of string data among which the key string data is situated is required to be checked.

In the circuit shown in FIG. 4, the bit line data B0 or B8 are directly connected to the transfer gate 4. In contrast with this, in the circuit shown in FIG. 14, the bit line data /B0 is connected through a logical circuit LCKT. In other words, the skip and sequential circuit CRC is so constructed as to output the signal IOG on the basis of the bit line data B0' of the mark bit of the succeeding string, in addition to the mark bit of the current string. In FIG. 14, the signal /B0 indicates the complementary signal of the bit line data B0 of the mark bit column of the current string, and the signal B0' indicates the bit line data of the mark bit column of the succeeding string. When the signal PRESTR (the preceding string) is "1" and the succeeding string mark bit is "1", even if the current string mark bit is "0", the skip and sequential circuit is so constructed as to output the signal IOG of "1". Therefore, when data are read skippingly and sequentially, the string one before the marked string can be read, it is possible to select the preceding string data.

Some examples of the data selection by use of the circuit construction of the second embodiment according to the present invention will now be described.

(i) Rearrangement of random packet data

Table 1 lists an example of this case.

See Table 1

Table 1 indicates that data read by asynchronous data transfer (ATM) can be restored by giving a header as a key string and by reading the data skippingly and sequentially.

In more detail, each data packet is of fixed length and is composed of a header and a data portion. Further, the data packets with the header are arranged at random. In this example, the data packet is composed of a header of one string and data of one string. When the signals inputted to the string match mark circuit are set to the conditions as listed below, the match selection executed for the skip and sequential read collect and arrange the data belonging to the header.

| |
|---|
| /MKCMP "1" |
| /MKCNP "0" |
| /MKNXT "1" |
| RSMKK "0" or "1" |
| RSMKS "0" |

When the header and the data are formed of many strings, it is possible to form another selection method in combination with other application examples described later.

(ii) Selection of hierarchically classified data

Table 2 lists an example of this case.

See Table 2

In the case where there exist data classified in an hierarchical structure, Table 2 indicates that the hierarchical classification items can be regarded as construction of the headers as explained in Item (i) above. In this example, the case where data after the classification item data a1, b2 and c2 are selected will be explained. The dots over the respective data represent that the strings are marked. After data have been selected and marked, the unused marks are deleted from these marks so that only the data required can be read skippingly and sequentially. The symbol (R) attached after the key represent a selection such that the marks of the succeeding string after the match string is reset. The respective settings of the signals to the string match mark circuits SMM by the respective key selection are listed in Table 3 below.

See Table 3

(iii) Selection of data having key strings in which the head key is not repeated Table 4 lists an example of this case.

See Table 4

As understood by Table 4, this application example shows a selection of data of non-fixed length. The fact that the head key is not repeated in the key string implies that A does not exist in a series of key data to be selected and keys other than A can be repeated. Various selection paths exist beginning from the head key A (as connected by lines). Here, however, the case where T of the data hung from these paths is read will be explained.

Although the general key procedure is shown, the head key IN must not be included in a key string from K1 to Kn. That is, the head key is not repeated. The data selection operation is continued in such a way that marks are attached to the data string through the selection with the marked key and marks attached to the key data string are deleted by the preceding key. Since only the head key is selected by the non-marked key, all the keys after the key data string A are marked if they are composed of a series of "A"s. To delete the marks, its own mark is deleted (SR) by the marked head key A (having a dot thereover). In this selection, the key data strings are given from the beginning, or it is possible to trace the key string by reading and selecting the key strings one by one. In the latter case, the selection is such that data are selected one by one from the key candidates by going and branching ahead into one branch.

The settings of the signals to the string match mark circuits SMM when its own mark is deleted in the key procedure such as IN (SR) are as follows:

/MKCMP "0"
/MKCNT "1"
/MKNXT "1"
RSMKK "1"
RSMKS "0" or "1"

The set conditions other than the above selection are already shown in the application examples already explained.

(iv) Sequential read of the string data

Table 5 lists an example of this case.

See Table 5

This method is to read the succeeding data in sequence accompanied with the read data themselves. When the mark bits and the END of the data read skippingly and sequentially are disregarded, string data can be obtained. Since "heading" is attached only to the head X1, the memory cells can be economized as compared with when "heading" is attached to the respective Xi, however a long time is required to read data. The application example explained herein corresponds to the case where there exists no data branch in the key after the head key and thereby the data are isolated under the key in the application example already explained in Item (iii). Here, the head key corresponds to the "heading". In this example, it is unnecessary to delete the key marks, and data can be read skippingly and sequentially from the heading to the end. Further, since the marks are not deleted, it is possible to shorten the selection time.

(v) Sequential read of the string data

Table 6 lists an example of this case.

See Table 6

Table 6 indicates that data are read by marking the string matched with the key string and the succeeding string and thereafter by setting mark bits to the preceding skip and sequential read circuits CRC when the mark bits are set to the skip and sequential read circuits. The string matched with the key data and the succeeding string are marked. The settings of the signals to the string match mark circuits SMM at the selection X & key mark are as listed below:

/MKCMP "0"
/MKCNT "0"
/MKNXT "1"
RSMKK "0"
RSMKS "0"

Further, the string data c can be read by setting the signal PRESTR to "1". It is also possible to trace back the data in the preceding direction by using this string data c as the key.

(vi) Classifying data selection

Table 7 lists an example of this case.

See Table 7

In this selection, it is possible to select data match conditions by providing various attributes for the key string bits.

When data are long extending over a plurality of string data, the string following the marked string is also marked by the signal MKNXT.

This application example can be applied to all the application examples already explained. In more detail, one method is that only a part of bits are match-selected without match-selecting all the bits constituting the string, and the other method is that when data exist extending over a plurality of strings, the succeeding string after the marked string is required to be marked.

In this example, bits with x are disregarded, so that these bits are set to the "don't care" state of register of the string bit register circuits SBR.

In the selection such that the succeeding string after the marked string is marked (MKNXT) in a plurality of the strings constituting data, the mark bit is set to "1" and the settings of the signals to the string match mark circuits are determined as listed below:

|  |  |
|---|---|
| /MKCMP | "1" |
| /MKCNT | "0" |
| /MKNXT | "0" |
| RSMKK | "0" or "1" |
| RSMKS | "0" |

Incidentally, the marking function of this example is the same as that obtained when the string bit register circuits are set by disregarding the bits other than the marked bits.

The data selection by disregarding data other than the marked bits can be used as various mark reset functions. For instance, the RS signal function as explained before can be realized by setting the string bit register circuits SBR (which disregard data other than the marked bits) to "1" for only the marked bits and further by setting the string match mark circuits SMM as I or II as listed below:

|  | I | II |
|---|---|---|
| /MKCMP | "0" | "0" |
| /MKCNT | "1" | "1" |
| /MKNXT | "0" | "1" |
| RSMKK | "1" | "1" |
| RSMKS | "0" OR "1" | "0" OR "1" |

Further, in the operation of the mark reset selection having (R) in the application examples (ii) and (iii), instead of giving a complete key string, it is possible to select data by setting "0" to the mark bits in the string bit register circuits SBR which disregard the data other than the mark bits in order to reset the mark bit of the marked string next to the unmarked ("0" mark bit) string.

As described above in Items (i) to (vi), it is possible to execute data access in a way suitable to the information contents by operating the mark bits in various methods and by use of the skip and sequential read circuits for the marked strings. This cannot be done in the prior art memory device. Therefore, it is possible to provide a memory device necessary for constituting an IOS (information oriented system) which may be a future-oriented information processing system.

In other words, in the respective application examples as described above, marks can be set freely to the key-match string and the succeeding string; the string preceding the marked string can be read by the skip and sequential read circuit; and the data selection function for setting string marks freely depending only on the presence or absence of marks can be realized.

Figure 15:
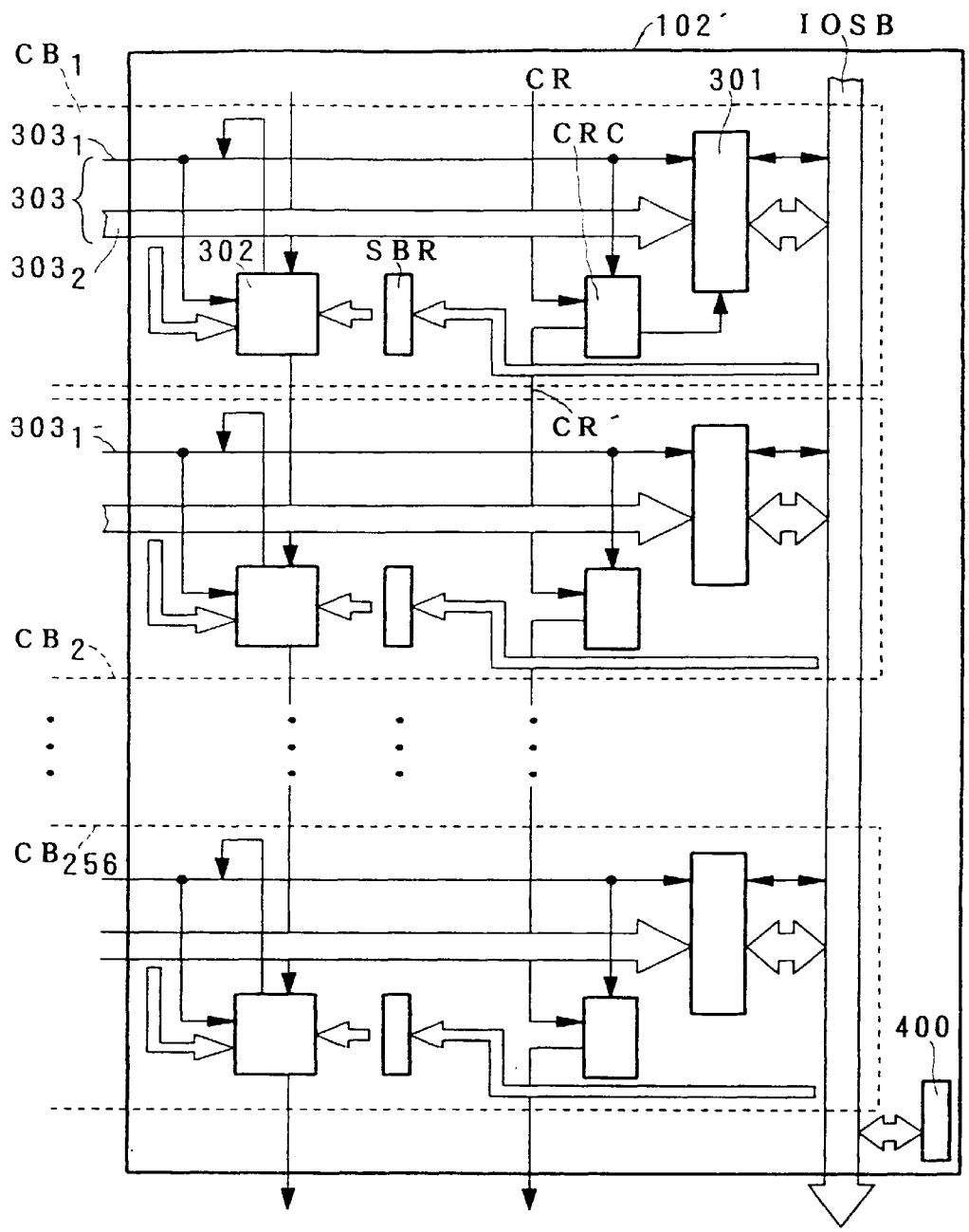
FIG. 15 is a block diagram showing a third embodiment of the selected data transfer device according to the present invention.

FIG. 15 shows a third embodiment of the present invention. Since being the same as that shown in FIG. 1, the detailed circuit construction is omitted.

In FIG. 15, the selected data transfer circuit 102' is modified. As explained, the selected data transfer circuit is composed of the column select units belonging to the respective column blocks CB. Further, each column select unit or each column block is connected to the 8-bit data bus and string data bus IOSB (an extension of both the data bus 106 and the string data bus 107 shown in FIG. 1, in which a multiplexer circuit (not shown) is inserted). Further, in the selected data transfer circuit 102' of the third embodiment, the data register 400 is connected to the data bus and string data bus IOSB.

Each column block CB includes 8-bit column data line bundle 303 connected to the memory cells, and the column data line bundle 303 is composed of a one-bit upper column data line $303_1$ and a 7-bit lower column data line bundle $303_2$. Each column block CB is further composed of a column gate circuit 301, a skip and sequential read circuit CRC, a string bit register SBR, and a bit compare mark circuit 302.

The column gate circuit 301 connects the data bus and the string data bus IOSB to the column data line bundle 303.

The skip and sequential read circuit controls the column gate circuit 301 on the basis of data on the one-bit upper column data line and the signal CR supplied from the adjacent upper column block.

The string bit register SBR is composed of 8-bit register strings, which detect data on the data bus and string data bus IOSB for temporarily holding the data.

The bit compare mark circuit 302 compares the 8-bit data of the column data line bundle 303 with the 8-bit string data held by the string bit register SBR, and rewrites the comparison result in the column data bundle 303. Although there are many rewriting methods, the typical methods are: when both match, to write the "H" data in the succeeding upper column data line $303_1$ (in the column block adjacent to the lower side in FIG. 2), to write the "H" data in its own column data line $303_1$ (in the column block belonging to the column select unit), etc. As described below, the bit compare mark circuit 302 is composed of a bit comparator BCM and a string match mark circuit SMM.

The data register 400 is used to hold data selected at the first selection during the succeeding second data selection, when the first selected data is used as the string data.

In the above-mentioned circuit construction, it is possible to use the two buses (the data bus and the string bus used in the first and second embodiments) in common as a signal data bus, so that the chip area can be reduced to an extent. Further, since there exists a data register, it is possible to execute the sequential data selection without outputting the data from the chip, when the read data is returned as the string data in the above-mentioned "sequential read of the string data". As a result, it is possible to improve the data selection speed.

As described above, in the key string selection, it is important to activate the row, that is, the word line in sequence (not at random). Here, there exists a cell structure suitable for this purpose as described below, when compared with the conventional structure.

In the selection and access operation, it is important to increase the cell density, without increasing the number of refresh actions, rather than the random accessibility. The cascade type dynamic cell structure is suitable as the structure as described above. An example of the cell structure of this type is disclosed in IEEE JOURNAL OF SOLID-STATE CIRCUITS (November 1991, Vol. 26. No. 11. pp 1511 to 1518.

A fourth embodiment of the selective data memory device having cascade type memory cells according to the present invention will now be described with reference to FIGS. 16 and 17.

Figure 16:
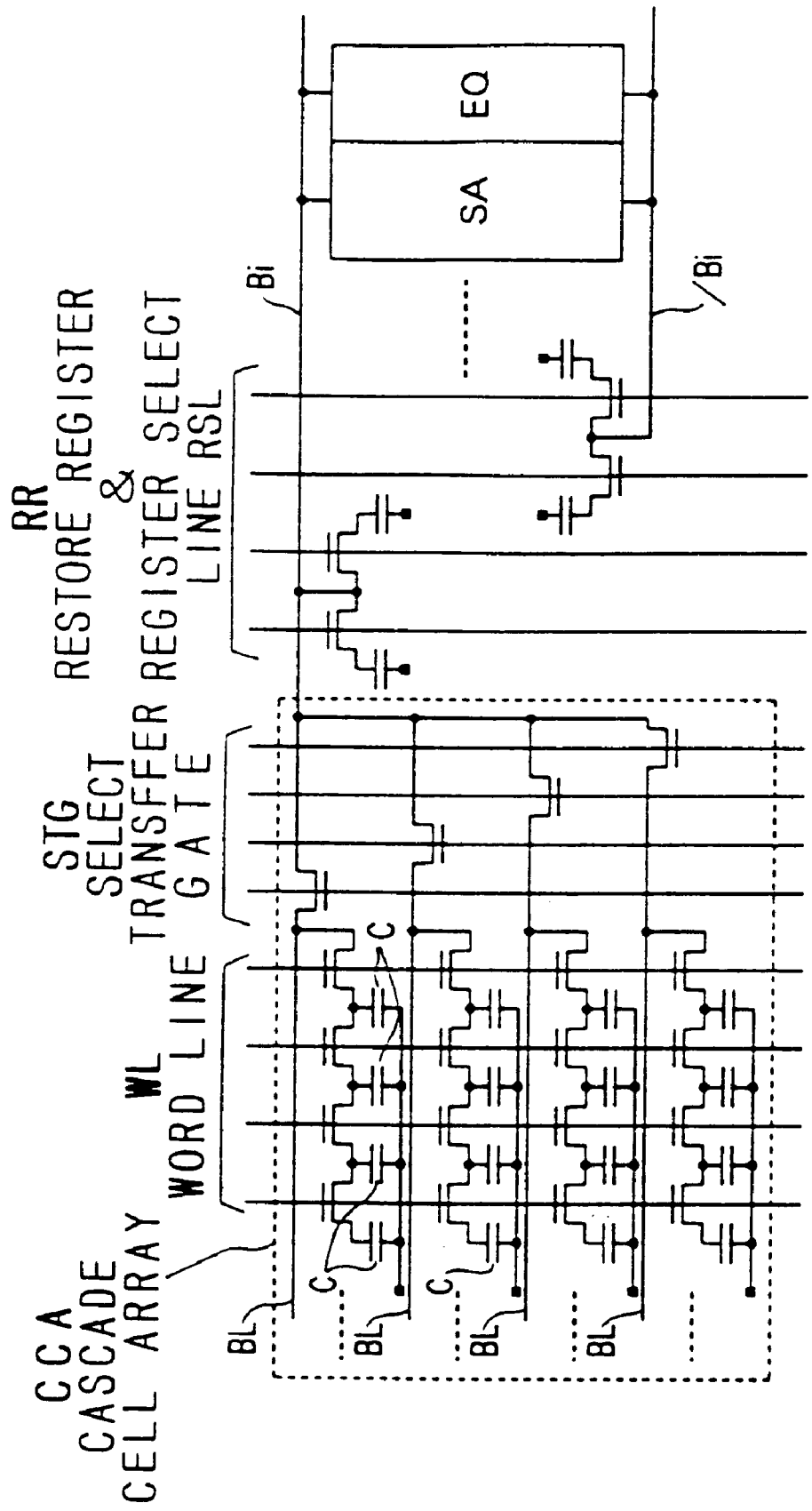
FIG. 16 is a circuit diagram explaining the cascade-type cell structure related to a fourth embodiment of the present invention.

FIG. 16 is a schematic diagram showing the cascade type cell structure.

The difference in structure from the ordinary DRAM is that cells C in the cascade cell array CCA are connected in series in cascade manner separated by word lines WL. Therefore, data can be read from the cells C beginning from the cells C nearest to the bit lines BL in sequence toward the inner cells C. Further, data can be written in the sequence opposite to the data read sequence.

When data is being read from the inner cell of the cascade-connected cells, the cell before the inner cell becomes a data transfer path. Accordingly, when the data of the cell (which becomes a transfer path) outside the inner cell is not held somewhere, the data is erased. The data are stored in restoring registers. The contents of the cascade cells are stored temporarily at the registers and then rewritten again to the cells sequentially from the inner cell, when the word line is closed.

In FIG. 16, four bit lines BL are connected in common to a common bit line Bi. Therefore, data stored in the cells connected to these bit lines BL are sensed by a common sense amplifier SA. Although not shown in FIG. 16, in the same way, four bit lines /BL are connected to a common bit line /Bi. The select transfer gates STG determine which one of the four bit lines BL must be selected.

Here, when the select transfer gates are regarded as the word lines, the access sequence is determined in series for each of 16 rows. In more detail, the uppermost word line WL of the cascade cells is opened, and the select transfer gates STG are opened in sequence to sense cell data. After that, the sensed data are stored in the restoring registers RR in sequence. Successively, the second word line WL is opened, and the select transfer gates STG are opened in sequence to sense cell data, to store the sensed data in the registers RR in sequence. The above-mentioned operation is repeated toward the innermost cell. Further, the data are written from the restoring registers RR to the cells C in the opposite sequence. As described above, a series of data read, write, and refresh can be completed.

The above-mentioned operation sequence depends on the organization of the cascade cells. In the case of the ordinary DRAM which requires random access, the restriction of the row access as described above limits the functions of the memory markedly. In the case of the key string data access memory, however, since the cells are basically accessed to all the rows, this restriction causes no problem.

In other words, in the memory device according to the present invention, when the memory cells constructed as shown in FIG. 16 are connected to the memory device of the first embodiment as shown in FIGS. 1, 2 and 3, it is possible to increase the cell density at least several tens percent, as compared with the ordinary DRAM, thus allowing the memory device to be suitable for a large capacity memory.

Figure 17:
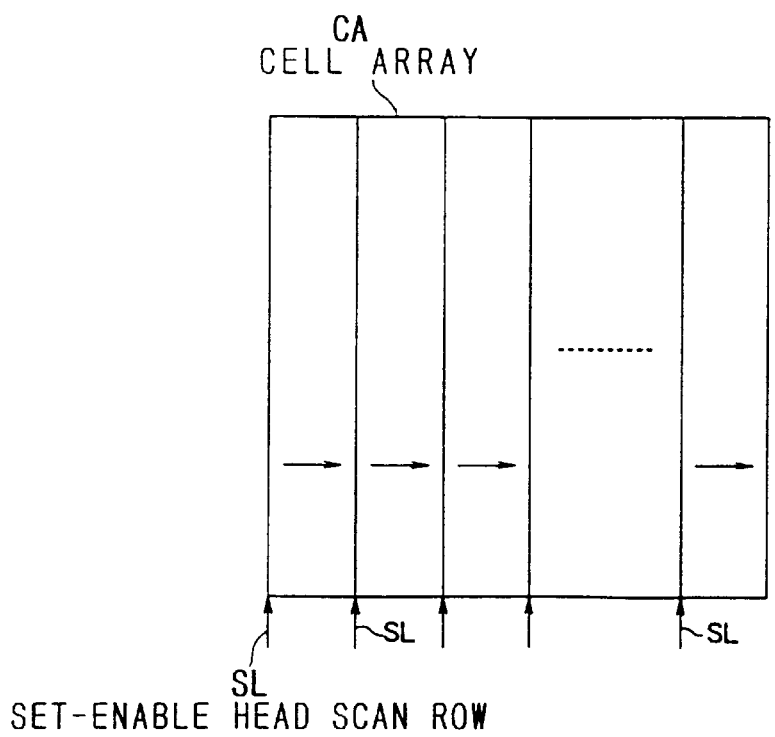
FIG. 17 is an illustration explaining the row scanning by use of the cascade cells.

FIG. 17 is an illustration explaining the row scanning of the cell array using the cascade cells. As shown, in the cell array CA, a head row can be determined freely in row groups whose access sequence is determined. However, within the row group, only the serial access is enabled under the restriction of the cascade cell access method, as explained. In FIG. 17, SL denotes head scan rows whose head row can be determined freely.

Further, in this embodiment, dynamic type memory cells are used and further a group of bit lines belonging to one sense amplifier is regarded as the columns for constituting the string data. Without being limited only to the dynamic type memory cells, it is possible to access the memory cells which do not require the refresh operation such as SROM and ROM cells, in quite the same way as described above.

Figure 18:
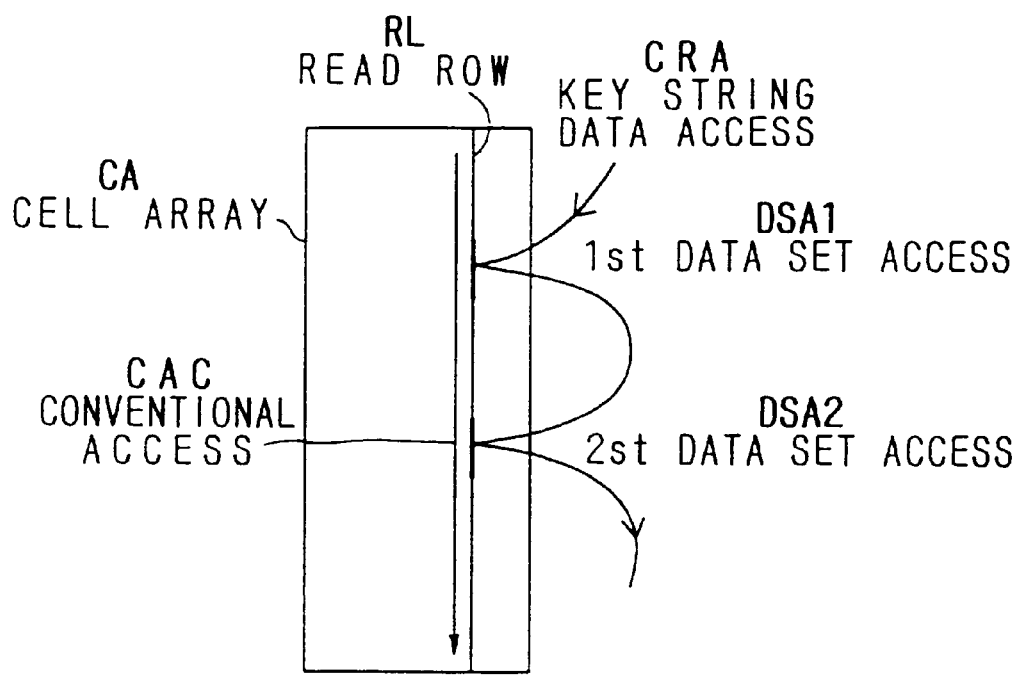
FIG. 18 is an illustration explaining the memory access method according to the present invention.

FIG. 18 is an illustration explaining the memory access method of the memory device according to the present invention, as compared with the prior art method.

Here, the assumption is made that there are first and second data sets 1 and 2 belonging to the key string data in a row. In this case, in the prior art access CAC, it is necessary to read data of all the cells of the cell array CA to find the key string data. In contrast with this, in the present invention, a mark is attached to the data set when refreshed, and the marked data sets are accessed skippingly and sequentially. Accordingly, only three accesses are required skippingly and sequentially, including the confirmation that no other marked data sets are found. That is, in the present invention, the three required accesses are the key string data access CRA by taking the read row RL into account, the first data set access DSA1, and data set access DSA2, thus improving the efficiency of the selection type access markedly.

As described above, in the memory device according to the present invention, in the key string data access type memory, the key string data and the data set are written in combination; a mark is attached to the string data according to the string selection result; and the string data are accessed on the basis of the marked data. In addition, where the selected data are of tree structure, only necessary data of a branch end can be accessed on the basis of the appropriate selection and marking. Consequently, it is possible to improve the key string selection efficiency markedly, and to enable the use of the cascade cell structure, with the result that the cell density can be improved and further a structure suitable for a large capacity memory can be realized.

A fifth embodiment of the present invention will now be described with reference to FIG. 19. In the fourth and fifth embodiments of the present invention, the selective data memory device has been explained. However, without being limited to only the selective data memory device, the present invention can be used as a selected data transfer device. For instance, in data communications, the present invention can be used when the received packet data are decoded. In the packet data communications, data groups of different sorts are mixed in one packet. Therefore, in the packet data reception, it is necessary to divide data into a plurality of data groups. Here, when the key strings are allocated to the respective data groups, and further a header is attached to each data string, it is possible to resolve or decode the packet data by use of the selected data transfer device according to the present invention.

Figure 19:
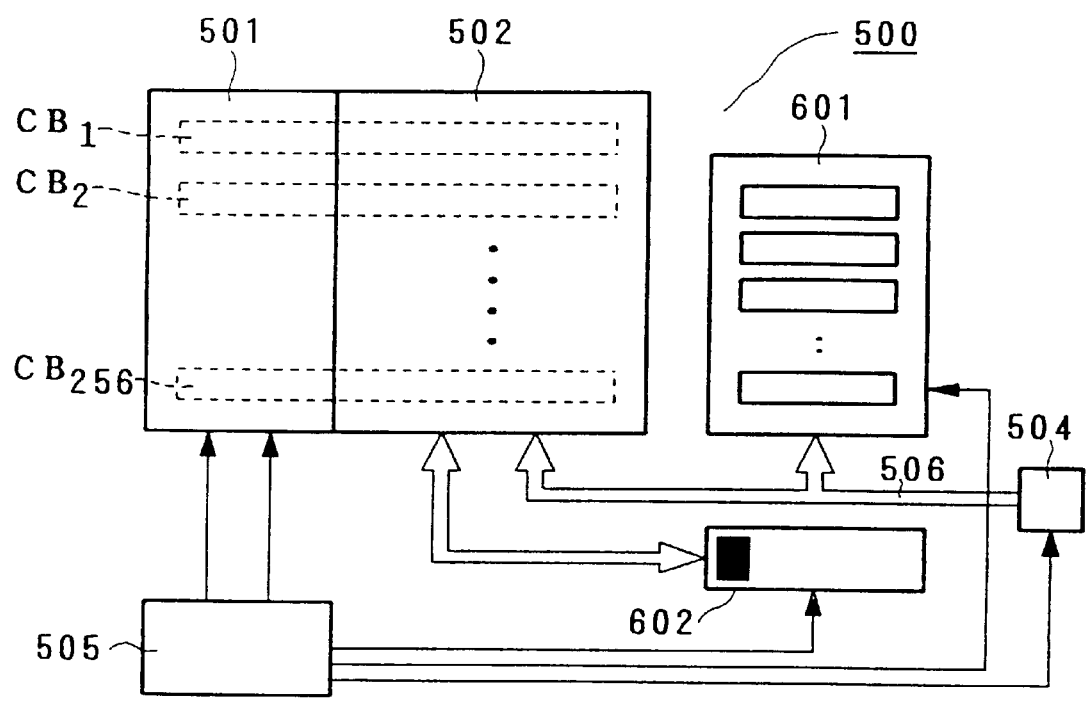
FIG. 19 is a block diagram showing a packet data receiver related to a fifth embodiment of the present invention.
Figure 20:
FIG. 20 is an illustration explaining ordinary memory access.
Figure 21:
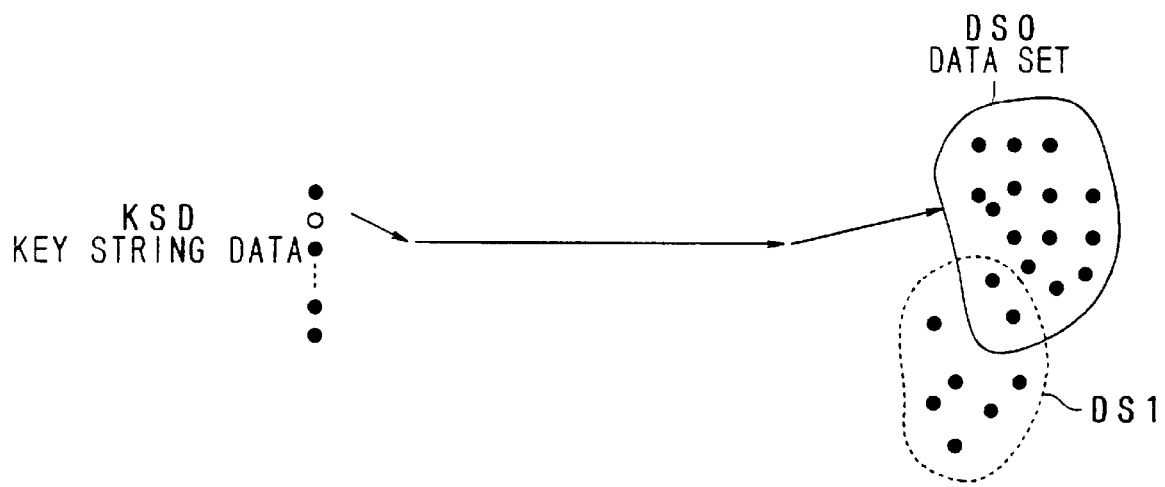
FIG. 21 is an illustration explaining a key string data access memory access.

FIG. 19 shows a data receiver used to decode the packet data. The data receiver 500 is composed of a register array 501, a selected data transfer circuit 502, a data receiver circuit 504, and a control circuit 505. Further, the register array 501 and the selected data transfer circuit 502 are both divided into a plurality of column blocks CB, and data are transferred for each column block CB. Further, the selected data transfer circuit 502 and the data receiver circuit 504 are connected through a data bus 506. The register array 501 is constructed by arranging a plurality of flip-flop circuits along the column lines.

The selected data transfer circuit 502 compares read data for each column block on the basis of the string data inputted from the outside or obtained in the preceding cycle, stores the comparison results, and transfers data on the basis of the stored comparison results. The data transfer operation is executed in sequence on the basis of a clock given by the control circuit 505. The data transfer is executed partially on the basis of the comparison results, without transferring data of all the column blocks. As already explained, since the selected data transfer circuit 502 transfers data partially on the basis of the comparison results, it is possible to improve the data selection speed.

The control circuit 505 controls the operation of the register array 501, the selected data transfer circuit 502 and the data receiver circuit 504.

Further, the data receiver 500 includes a register file 601, and a string data register 602. The register file 601 stores the selected data transferred in sequence by the selected data transfer circuit 502. On the other hand, the string data register 602 holds the string data to be given to the selected data transfer circuit 502. The string data register 602 is connected to the selected data transfer circuit 502 through the string data bus. The selected data transfer circuit 502 is basically of the same construction as that of the selected data transfer circuit shown in FIG. 11 (except that the sense amplifiers SA and the equalize circuits EQ are omitted), so a detailed description thereof is omitted. To the bit line pairs, flip-flops are connected as the data registers.

The operation of the data receiver will now be described with reference to FIG. 11.

First, the data input operation to the register array will be explained. When data are inputted to the register array, the registers are connected to the bit line pairs, and the IO bit line pairs IO0 to IO7 and /IO0 to /IO7 are connected to the bit line pairs B0 to B7 and /B0 to /B7, respectively.

Data are inputted 8 bits by 8 bits in series. The SAC signal is set to the "H" level in pulse state to set all the skip and sequential read circuits CRC to the select condition. After that, the CR signal is given in pulse state. When the CR signal is being kept at the "H" level, the IOC signal is set to the "H" level, so that the I/O line pairs are connected to the bit lines. That is, the skip and sequential circuits CRC are selected in sequence for each CR pulse signal, and are connected to the I/O lines in sequence 8 columns by 8 columns. Under these conditions, when data are supplied to the I/O line pairs appropriately, it is possible to input packet data to the register array.

The decoding of the packet data will now be described.

First, the STR signal is set to the "H" level to open the string registers SBR corresponding to the string bits 0 to 7. Under these conditions, the string data for selecting the string bit data lines SB0 to SB7 (i.e., the head data of the data groups) are given. As a result, the key string data are written in the string registers SBR. Since the string bit registers SBR are composed of 8-bit units in this case, the same key string data are written in all the string bit registers SBR of 8-bits. After that, when the CMPTR signal is set to the "H" level in pulse state, data in the register array are transferred to the bit comparators. Further, by setting the CMP signal to the "H" level, the transferred data and the respective bit data written in the string bit registers SBR are compared with each other. When both the compared bit data match, the /BMTCi signal outputted from the bit comparators BCM changes to the "L" level. When all the 8-bit string data match each other, the string match mark circuit SMM outputs the SMTC signal of the "H" level. Further, this signal is applied to the succeeding string match mark circuit SMM as the signal SMTC'.

As the result of the selection, when data which match the key string are found, it is understood that the 8-bits adjacent to the matched key string data are the data belonging to the key string. Next, it is necessary to mark the data set. When the 8-bits (0 to 7) shown in FIG. 11 are assumed to be the matched key string data, the signal SMTC' changes to the "H" level, and is then applied to the string match mark circuits of the B8 and /B8 columns shown in FIG. 11. Here, when the signal /MKCNT is set to the "L" level, "1" is written in the B8-/B8 column. As described above, "1" is written simultaneously in all the column blocks belonging to all the matched strings.

The above-mentioned operation can be executed simultaneously. Further, the selected strings are marked by setting the 0-th bit to "1" or resetting it to "0".

Access is made to the strings whose 0-th bit is marked with "1". A possibility exists such that there are a number of marked strings and therefore a plurality of marked strings exist.

These marked strings are accessed skippingly and sequentially. To detect the 0-th bits of the strings of each column by the skip and sequential read circuit CRC, the signal IOGON is set to the "H" level in pulse state. After that, the signal IOGON is set to the "L" level to toggle the signal CR. As a result, when the signal CR is kept at the "H" level, the first marked 8-bit string in the data registers is connected to the I/O lines.

Further, when the signal CR is kept toggled, the marked strings can be accessed in sequence, so that it is possible to read data belonging to the strings.

Where there exists no marked string in the data registers or after the final marked string has been accessed, the signal CRL is set to the "H" level, so that it is possible to indicate that there exists no string to be accessed in the data registers.

As described above, the data read continuously by the skip and sequential read circuits are stored in the register file 601. These data are data groups corresponding to the predetermined key string, so that the data have been decoded.

As described above, when the circuit construction as described above is used, it is possible to decode the packet data simply at a high speed.

The first to fifth embodiments according to the present invention have been described. However, the present invention is not limited to only these embodiments. The present invention can of course be changed or modified without departing from the gist thereof.

TABLE 1

| A | D11 | B | D21 | A | D12 | C | D31 | B | D22 | A | D13 |
|---|---|---|---|---|---|---|---|---|---|---|---|
| KEY: A | | SKIP & SEQUENTIAL : READ DATA | | | | | | D11 D12 D13 ... | | | |
| KEY: B | | | | | | | | D21 D22 ... | | | |
| KEY: C | | | | | | | | D31 ... | | | |

TABLE 2

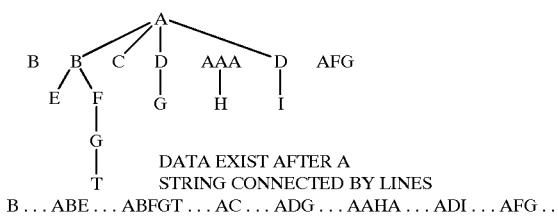

| KEY | ... a1b1c1Xa2b3c3Ya1b2c2D1a1b1c2Za1b2c2D2a2b1c3Qa1b3c1Ra1b2c2D3a1b2c3W ... |
|---|---|
| a1 | ... a1b1c1Xa2b3c3Ya1b2c2D1a1b1c2Za1b2c2D2a2b1c3Qa1b3c1Ra1b2c2D3a1b2c3W ... |
| b2 | ... a1b1c1Xa2b3c3Ya1b2ċ2D1a1b1c2Za1b2ċ2D2a2b1c3Qa1b3c1Ra1b2ċ2D3a1b2ċ3W ... |
| c2 | ... a1b1c1Xa2b3c3Ya1b2ċ2Ḋ1a1b1c2Za1b2ċ2Ḋ2a2b1c3Qa1b3c1Ra1b2ċ2Ḋ3a1b2ċ3W ... |
| a1 (R) | ... a1b1c1Xa2b3c3Ya1b2ċ2Ḋ1a1b1c2Za1b2ċ2Ḋ2a2b1c3Qa1b3c1Ra1b2ċ2Ḋ3a1b2c3W ... |
| b2 (R) | ... a1b1c1Xa2b3c3Ya1b2c2Ḋ1a1b1c2Za1b2c2Ḋ2a2b1c3Qa1b3c1Ra1b2c2Ḋ3a1b2c3W ... |
| SKIP & SEQUENTIAL READ → D1   D2   D3 | |

TABLE 3

| | | |
|---|---|---|
| /MKCMP | "1" | "1" |
| /MKCNT | "0" | "0" |
| RSMKS | "0" | "1" |
| | a1, ḃ2, ċ2 | a1 (R), b2 (R) |

TABLE 4

```
            A
    ┌───┬───┼───┬───┐
    B   B   C   D   AAA   D   AFG
        │       │         │
        E   F   G         H   I
            │
            G
            │
            T
```

DATA EXIST AFTER A
STRING CONNECTED BY LINES
... B ... ABE ... ABFGT ... AC ... ADG ... AAHA ... ADI ... AFG ..

KEY A B F G (SR: MARK RESET OF KEY STRING R: MARK RESET OF NEXT STRING)

| KEY PROCEDURE; | 1N, K̇1, 1Ṅ (SR), 1N (R), K2, K1 (R), K̇3, K2 (R), . . ., Kn−1, Kn−2 (R), K̇n, Kn−1 (R) |
|---|---|
| 0 ; A | ... B ... ABE ... ABFGT ... AC ... ADG ... AAHAẊ ... ADI ... AFG ... |
| 1 ; Ḃ | ... B ... ABĖ ... ABFGT ... AC ... ADG ... AAHAẊ ... ADI ... AFG ... |
| 2 ; Ȧ (SR) | ... B ... ABĖ ... ABFGT ... AĊ ... ADG ... AAHAẊ ... ADI ... AFG ... |
| 3 ; A (R) | ... B ... ABĖ ... ABFGT ... AC ... ADG ... AAHAX ... ADI ... AFG ... |
| 4 ; Ḟ | ... B ... ABĖ ... ABḞGT ... AC ... ADG ... AAHAX ... ADI ... AFG ... |
| 5 ; B (R) | ... B ... ABE ... ABḞGT ... AC ... ADG ... AAHAX ... ADI ... AFG ... |
| 6 ; Ġ | ... B ... ABE ... ABFĠT ... AC ... ADG ... AAHAX ... ADI ... AFG ... |
| 7 ; F (R) | ... B ... ABE ... ABFĠT ... AC ... ADG ... AAHAX ... ADI ... AFG ... |

TABLE 5

··· Heading, X1, X2, X3, ···, Xn − 1, Xn, End, ···
STRING DATA x1 x2 x3 ... Xn CAN BE READ ON HEADING

| KEY ; Heading | READ : Ẋ˙1 |
|---|---|
| KEY ; Ẋ˙1 | READ : Ẋ˙1, Ẋ˙2 |
| KEY ; Ẋ˙2 | READ : Ẋ˙1, Ẋ˙2, Ẋ˙3 |

.
.
.

TABLE 5-continued

| KEY ; Ẋ˙n − 1 | READ : Ẋ˙1, Ẋ˙2, Ẋ˙3, ···, Ẋ˙n − 1, Ẋ˙n |
|---|---|
| KEY ; Ẋ˙n | READ : Ẋ˙1, Ẋ˙2, Ẋ˙3, ···, Ẋ˙n − 1, Ẋ˙n, End |

TABLE 6

···, a, b, c, X, A, B, C, ···
STRINGS BEFORE AND AFTER X ARE REQUIRED TO READ
KEY ; X & Key Mrak ···, a, b, c, Ẋ, Ȧ, B, C, ···

| SIMPLE SKIP & SEQUENTIAL READ | : Ẋ, Ȧ |
|---|---|
| PRESTR SKIP & SEQUENTIAL READ | : c, Ẋ, Ȧ |

*WHEN SELECTED WITH C AS KEY, DATA AHEAD CAN BE SELECTED FURTHER

TABLE 7

| | | | |
|---|---|---|---|
| 1 0 0 1 | N | O |
| 0 0 1 0 | I | N |
| 0 1 1 0 | O | N |
| 1 0 0 1 | U | P |
| 0 0 1 0 | T | O |
| 0 1 1 0 | O | F |
| 0 0 1 0 | A | T |
| 0 1 0 1 | O | R |
| 0 0 0 1 | G | O |
| 0 0 0 1 | B | E |
| 1 1 0 1 | O | K |
| 0 0 0 1 | W | E |

Key ; | x 1 1 x | , MKNXT
READ    ON, OF

Key ; | 1 x x 1 | , MKNXT
READ    NO, UP, OK

Key ; | x 1 x 1 | , MKNXT
READ    OR, OK

Key ; | x 1 x 0 | , MKNXT
READ    ON, OF

Key ; | 0 0 1 0 | , MKNXT
READ    IN, TO, AT

What is claimed is:

1. A selective data memory device comprising:
a memory cell array composed of a plurality of memory cells arranged into a matrix pattern and divided into a plurality of column blocks; and
selected data transferring means for comparing string data inputted from outside of the memory cell array with data in each of the column blocks, selectively marking the column blocks according to the comparison results, and transferring the data in the marked column blocks in sequence to the outside of the memory cell array,
wherein the selected data transferring means compares the string data with data in each of the column blocks and selectively marks the column blocks based on the comparison results to indicate the column blocks whose data matches the string data, and
the selected data transferring means then sequentially transfers the data in the marked column blocks so that data is transferred successively from the marked column blocks, which match the string data, without having to compare the string data to the data in the column blocks,
wherein a plurality of column blocks are arranged in order, said selected data transferring means is divided into a plurality of column select units in correspondence to a plurality of the column blocks and provided with a data bus extending over a plurality of the column select units, each of the column blocks is provided with a column data line bundle for transferring read data, the column data line bundle is composed of a predetermined column data line and other column data lines, and each of the column select units is provided with a column gate for selectively connecting the column data line bundle to the data bus and a skip and sequential read circuit for controlling the column gate according to data on the predetermined column data line,
wherein the skip and sequential read circuit, when data on the predetermined column data line is at a first level, controls connection of the column gate according to a signal applied from a skip and sequential read circuit in the column block immediately before the column block belonging to the current skip and sequential read circuit, outputs a predetermined level signal to the skip and sequential read circuit in the succeeding column block, and when data on the predetermined column data line is at a second level, outputs a signal applied from the skip and sequential read circuit in the preceding column block to the current skip and sequential read circuit in the column block immediately after the column block belonging to the current skip and sequential read circuit, and opens the column gate.

2. The selective data memory device of claim 1, wherein said selected data transferring means marks a predetermined bit of data of each of the column blocks.

3. The selective data memory device of claim 1, wherein a plurality of the column blocks are arranged in order, and said selected data transferring means marks a column block next to the column block whose data match the string data, according to the comparison results.

4. The selective data memory device of claim 1, wherein a plurality of the column blocks are arranged in order, and said selected data transferring means marks a column block whose data match the string data, according to the comparison results.

5. The selective data memory device of claim 1, wherein a plurality of the column blocks are arranged in order, and said selected data transferring means transfers data in a column block immediately before the marked column block in response to a first signal.

6. The selective data memory device of claim 1, wherein a plurality of the column blocks are arranged in order, and said selected data transferring means marks a column block next to the column block whose data match the string data according to the comparison results and in response to a second signal, and deletes the mark of the column block next to the column block whose data match the string data in response to a third signal.

7. The selective data memory device of claim 1, wherein a plurality of the column blocks are arranged in order, and said selected data transferring means marks a column block next to the column block whose data match the string data according to the comparison results and in response to a second signal, and deletes the mark of the column block whose data match the string data in response to a fourth signal.

8. The selective data memory device of claim 1, wherein each of the column select units comprises bit comparing and marking means for comparing data on the column data line bundle with the string data given by the string data bus, outputting the comparison result to the succeeding column block according to the comparison results and in response to a fifth signal, and marking the predetermined column data line on the basis of the comparison result given from the preceding column block.

9. The selective memory device of claim 8, wherein said bit comparing and marking means comprises string bit registering means for detecting and storing the string data on the string data bus; the data held by said string bit register means are three-value data composed of first, second and third values; when said string bit registering means stores the third data for a bit, the comparison result between the column data line bundle data and the string data of the bit is regarded as being matched with each other irrespective of the comparison result.

10. The selective data memory device of claim 1, wherein the memory cells are dynamic memory cells.

11. The selective data memory device of claim 1, wherein the memory cells are static memory cells.

12. The selective data memory device of claim 1, wherein the memory cells are cascade-connected dynamic memory cells.

13. The selective data memory device of claim 1, wherein the memory cells are NAND type EEPROM cells.

14. The selective data memory device of claim 1, wherein the memory cells are ROM cells.

15. A data selecting device comprising:
   a register array composed of a plurality of registers and divided into a plurality of column blocks; and
   selected data transferring means for comparing string data inputted from outside of the register array with data in each of the column blocks, selectively marking the column blocks according to the comparison results, and transferring the data in the marked column blocks in sequence to the outside of the register array,
   wherein the selected data transferring means compares the string data with data in each of the column blocks and selectively marks the column blocks based on the comparison results to indicate the column blocks whose data matches the string data, and
   the selected data transferring means then sequentially transfers the data in the marked column blocks so that data is transferred successively from the marked column blocks without having to compare the string to the data in the column blocks,
   wherein a plurality of column blocks are arranged in order, said selected data transferring means is divided into a plurality of column select units in correspondence to a plurality of the column blocks and provided with a data bus extending over a plurality of the column select units, each of the column blocks is provided with a column data line bundle for transferring read data, the column data line bundle is composed of a predetermined column data line and other column data lines, and each of the column select units is provided with a column gate for selectively connecting the column data line bundle to the data bus and a skip and sequential read circuit for controlling the column gate according to data on the predetermined column data line,
   wherein the skip and sequential read circuit, when data on the predetermined column data line is at a first level, controls connection of the column gate according to a signal applied from a skip and sequential read circuit in the column block immediately before the column block belonging to the current skip and sequential read circuit, outputs a predetermined level signal to the skip and sequential read circuit in the succeeding column block, and when data on the predetermined column data line is at a second level, outputs a signal applied from the skip and sequential read circuit in the preceding column block to the current skip and sequential read circuit in the column block immediately after the column block belonging to the current skip and sequential read circuit, and opens the column gate.

16. The data selecting device of claim 15, wherein said selected data transferring means marks a predetermined bit of data of each of the column blocks.

17. The data selecting device of claim 15, wherein a plurality of the column blocks are arranged in order, and said selected data transferring means marks a column block next to the column block whose data match the string data, according to the comparison results.

18. The data selecting device of claim 15, wherein a plurality of the column blocks are arranged in order, and said selected data transferring means marks a column block whose data match the string data, according to the comparison results.

19. The data selecting device of claim 15, wherein a plurality of the column blocks are arranged in order, and said selected data transferring means transfers data in a column block immediately before the marked column block in response to a first signal.

20. The data selecting device of claim 15, wherein a plurality of the column blocks are arranged in order, and said selected data transferring means marks a column block next to the column block whose data match the string data according to the comparison results and in response to a second signal, and deletes the mark of the column block next to the column block whose data match the string data in response to a third signal.

21. A method of selecting data of hierarchical structure using a data selecting device, the data selecting device having:
   a memory element array composed of a plurality of memory elements and divided into a plurality of column blocks arranged in order; and
   selected data transferring means for comparing string data inputted from outside of the memory element array with data stored in the memory elements in each of the column blocks, selectively marking the column blocks according to the comparison results, and transferring the data stored in the memory elements in the marked column blocks in sequence to the outside of the memory element array, said selected data transferring means is divided into a plurality of column select units in correspondence to a plurality of the column blocks and provided with a data bus extending over a plurality of the column select units, each of the column blocks is provided with a column data line bundle for transferring read data, the column data line bundle is composed of a predetermined column data line and other column data lines, and each of the column select units is provided with a column gate for selectively connecting the column data line bundle to the data bus and a skip and sequential read circuit for controlling the column gate according to data on the predetermined column data line,
   said method of selecting data of hierarchical structure comprising the steps of:
   inputting a first string data to the selected data transferring means;
   comparing the inputted first string data with data stored in the memory elements in each of the column blocks;
   marking each of the column blocks that is immediately after one of the column blocks whose data matches the first string data;
   inputting a second string data to the selected data transferring means;
   comparing the inputted second string data with data stored in the memory elements in each of the column blocks;
   marking each of the column blocks that is immediately after one of the column blocks whose data matches the first string data;
   inputting a second string data to the selected data transferring means;
   comparing the inputted second string data with data stored in the memory element in each of the column blocks;
   marking each of the column blocks that is immediately after one of the column blocks that was previously marked and whose data matches the second string data;
   inputting the first string data again to the selected data transferring means;

comparing the inputted first string data with data stored in the memory elements in each of the column blocks; and deleting the marks of each of the column blocks that is immediately after one of the column blocks whose data matches the first string data, wherein the skip and sequential read circuit, when data on the predetermined column data line is at a first level, controls connection of the column gate according to a signal applied from a skip and sequential read circuit in the column block immediately before the column block belonging to the current skip and sequential read circuit, outputs a predetermined level signal to the skip and sequential read circuit in the succeeding column block, and when data on the predetermined column data line is at a second level, outputs a signal applied from the skip and sequential read circuit in the preceding column block to the current skip and sequential read circuit in the column block immediately after the column block belonging to the current skip and sequential read circuit, and opens the column gate.

22. A method of selecting data of hierarchical structure using a data selecting device, the data selecting device of having:

a memory element array composed of a plurality of memory elements and divided into a plurality of column blocks arranged in order; and selected data transferring means for comparing string data inputted from outside of the memory element array with data stored in the memory elements in each of the column blocks, selectively marking the column blocks according to the comparison results, and transferring the data stored in the memory elements in the marked column blocks in sequence to the outside of the memory element array, said selected data transferring means is divided into a plurality of column select units in correspondence to a plurality of the column blocks and provided with a data bus extending over a plurality of the column select units, each of the column blocks is provided with a column data line bundle for transferring read data, the column data line bundle is composed of a predetermined column data line and other column data lines, and each of the column select units is provided with a column gate for selectively connecting the column data line bundle to the data bus and a skip and sequential read circuit for controlling the column gate according to data on the predetermined column data line, said method of selecting data of hierarchical structure comprising the steps of:

inputting a first string data to the selected data transferring means;

comparing the inputted first string data with data stored in the memory elements in each of the column blocks;

marking each of the column blocks that is immediately after one of the column blocks whose data matches the first string data;

inputting a second string data to the selected data transferring means;

comparing the inputted second string data with data stored in the memory elements in each of the column blocks;

marking each of the column blocks that is immediately after one of the column blocks that was previously marked and whose data matches the second string data;

inputting the first string data again to the selected data transferring means;

comparing the inputted first string data with data stored in the memory elements in each of the column blocks; and deleting the mark of each of the column blocks whose data matches the first string data, wherein the skip and sequential read circuit, when data on the predetermined column data line is at a first level, controls connection of the column gate according to a signal applied from a skip and sequential read circuit in the column block immediately before the column block belonging to the current skip and sequential read circuit, outputs a predetermined level signal to the skip and sequential read circuit in the succeeding column block, and when data on the predetermined column data line is at a second level, outputs a signal applied from the skip and sequential read circuit in the preceding column block to the current skip and sequential read circuit in the column block immediately after the column block belonging to the current skip and sequential read circuit, and opens the column gate.

23. A method of selecting data of hierarchical structure using a data selecting device, the data selecting device of having:

a memory element array composed of a plurality of memory elements and divided into a plurality of column blocks arranged in order; and selected data transferring means for comparing string data inputted from outside of the memory element array with data stored in the memory elements in each of the column blocks, selectively marking the column blocks according to the comparison results, and transferring the data stored in the memory elements in the marked column blocks in sequence to the outside of the memory element array, said selected data transferring means is divided into a plurality of column select units in correspondence to a plurality of the column blocks and provided with a data bus extending over a plurality of the column select units, each of the column blocks is provided with a column data line bundle for transferring read data, the column data line bundle is composed of a predetermined column data line and other column data lines, and each of the column select units is provided with a column gate for selectively connecting the column data line bundle to the data bus and a skip and sequential read circuit for controlling the column gate according to data on the predetermined column data line, said method comprising executing the steps of:

inputting a first string data to the selected data transferring means;

comparing the inputted first string data with data stored in the memory elements in each of the column blocks;

marking each of the column blocks that is immediately after one of the column blocks whose data matches the first string data;

and repeating the sub-steps of:

wherein the last data transferred and outputted in the preceding step or substep is data indicative of an end of a data string, ending the substeps; and when the last data transferred and outputted in the preceding step or sub-step is not data indicative of the end of a data string, inputting the last data to the selected data transferring means as a next string data, comparing the next string data with the data stored in the memory elements in each of the column blocks, and marking each of the column blocks that is immediately after one of the column blocks whose data matches the next string data, wherein the skip and sequential read circuit, when data on the predetermined column data line is at a first level, controls connection of the column gate according to a signal applied from a skip and sequential read circuit in the column block immediately before the column block belonging to the current skip and sequential read circuit, outputs a predetermined level signal to the skip and sequential read circuit in the succeeding column block, and when data on the predetermined column data line is at a second level, outputs a signal applied from the skip and sequential read circuit in the preceding column block to the current skip and sequential read circuit in the column block immediately after the column block belonging to the current skip and sequential read circuit, and opens the column gate.

24. A selective data memory device comprising:

a memory cell array composed of a plurality of memory cells arranged into a matrix pattern and divided into a plurality of column blocks; and selected data transferring means for comparing string data inputted from outside of the memory cell array with data in each of the column blocks, selectively marking the column blocks according to the comparison results, and transferring the data in the marked column blocks in sequence to the outside of the memory cell array, wherein the selected data transferring means compares the string data with data in each of the column blocks and selectively marks the column blocks based on the comparison results to indicate the column blocks whose data matches the string data, and the selected data transferring means then sequentially transfers the data in the marked column blocks so that data is transferred successively from the marked column blocks, which match the string data, without having to compare the string data to the data in the column blocks, wherein a plurality of the column blocks are arranged in order; said selected data transferring means is divided into a plurality of column select units in correspondence to a plurality of the column blocks and provided with a data bus extending over a plurality of the column select units, each of the column blocks is provided with a column data line bundle for transferring read data; the column data line bundle is composed of a predetermined column data line and other column data lines; and each of the column select units comprises bit comparing and marking means for comparing data on the column data line bundle with the string data given by the string data bus, outputting the comparison result to the succeeding column block according to the comparison results and in response to a fifth signal, and marking the predetermined column data line on the basis of the comparison result given from the preceding column block.

25. The selective memory device of claim 24, wherein said bit comparing and marking means comprises string bit registering means for detecting and storing the string data on the string data bus; the data held by said string bit register means are three-value data composed of first, second and third values; when said string bit registering means stores the third data for a bit, the comparison result between the column data line bundle data and the string data of the bit is regarded as being matched with each other irrespective of the comparison result.

26. The selective data memory device of claim 25, wherein said selected data transferring means marks a predetermined bit of data of each of the column blocks.

27. The selective data memory device of claim 25, wherein a plurality of the column blocks are arranged in order, and said selected data transferring means transfers data in a column block immediately before the marked column block in response to a first signal.

28. The selective data memory device of claim 25, wherein a plurality of the column blocks are arranged in order, and said selected data transferring means marks a column block next to the column block whose data match the string data according to the comparison results and in response to a second signal, and deletes the mark of the column block next to the column block whose data match the string data in the response to a third signal.

29. A data selecting device comprising:

a register array composed of a plurality of registers and divided into a plurality of column blocks; and selected data transferring means for comparing string data inputted from outside of the register array with data in each of the column blocks, selectively marking the column blocks according to the comparison results, and transferring the data in the marked column blocks in sequence to the outside of the register array, wherein the selected data transferring means compares the string data with data in each of the column blocks and selectively marks the column blocks based on the comparison results to indicate the column blocks whose data matches the string data, and the selected data transferring means then sequentially transfers the data in the marked column blocks so that data is transferred successively from the marked column blocks without having to compare the string to the data in the column blocks, wherein a plurality of the column blocks are arranged in order, said selected data transferring means is divided into a plurality of column select units in correspondence to a plurality of the column blocks and provided with a data bus extending over a plurality of the column select units, each of the column blocks is provided with a column data line bundle for transferring read data, the column data line bundle is composed of a predetermined column data line and other column data lines, and each of the column select units comprises bit comparing and marking means for comparing data on the column data line bundle with the string data given by the string data bus, outputting the comparison result to the succeeding column block according to the comparison results and in response to a fifth signal, and marking the predetermined column data line on the basis of the comparison result given from the preceding column block, wherein said bit comparing and marking means comprises string bit registering means for detecting and storing the string data on the string data bus, the data held by said string bit register means are three-value data composed of first, second and third values, when said string bit registering means stores the third data for a bit, the comparison result between the column data line bundle data and the string data of the bit is regarded as being matched with each other irrespective of the comparison result.

30. The data selecting device of claim 29, wherein said selected data transferring means marks a predetermined bit of data of each of the column blocks.

31. The data selecting device of claim 29, wherein a plurality of the column blocks are arranged in order, and said selected data transferring means transfers data in a column block immediately before the marked column block in response to a first signal.

32. The data selecting device of claim 29, wherein a plurality of the column blocks are arranged in order, and said selected data transferring means marks a column block next to the column block whose data match the string data according to the comparison results and in response to a second signal, and deletes the mark of the column block next to the column block whose data match the string data in the response to a third signal.

33. A method of selecting data of hierarchical structure using a data selecting device, the data selecting device having:

- a memory element array composed of a plurality of memory elements and divided into a plurality of column blocks arranged in order; and
- selected data transferring means for comparing string data inputted from outside of the memory element array with data stored in the memory elements in each of the column blocks, selectively marking the column blocks according to the comparison results, and transferring the data stored in the memory elements in the marked column blocks in sequence to the outside of the memory cell array,
- wherein said selected data transferring means is divided into a plurality of column select units in correspondence to a plurality of the column blocks and provided with a data bus extending over a plurality of the column select units, each of the column block is provided with a column data line bundle for transferring read data; the column data line bundle is composed of a predetermined column data line and other column data lines; and each of the column select units comprises bit comparing and marking means for comparing data on the column data line bundle with the string data given by the string data bus, outputting the comparison result to the succeeding column block according to the comparison results and in response to a fifth signal, and marking the predetermined column data line on the basis of the comparison result given from the preceding column block, and
- wherein said bit comparing and marking means comprises string bit registering means for detecting and storing the string data on the string data bus, the data held by said string bit register means are three-value data composed of first, second and third values, when said string bit registering means stores the third data for a bit, the comparison result between the column data line bundle data and the string data of the bit is regarded as being matched with each other irrespective of the comparison result,
- said method of selecting data of hierarchical structure comprising the steps of:
  - inputting a first string data to the selected data transferring means;
  - comparing the inputted first string data with data stored in the memory elements in each of the column blocks;
  - marking each of the column blocks that is immediately after one of the column blocks whose data matches the first string data;
  - inputting a second string data to the selected data transferring means;
  - comparing the inputted second string data with data stored in the memory elements in each of the column blocks;
  - marking each of the column blocks that is immediately after one of the column blocks whose data matches the first string data;
  - inputting a second string data to the selected data transferring means;
  - comparing the inputted second string data with data stored in the memory element in each of the column blocks;
  - marking each of the column blocks that is immediately after one of the column blocks that was previously marked and whose data matches the second string data;
  - inputting the first string data again to the selected data transferring means;
  - comparing the inputted first string data with data stored in the memory elements in each of the column blocks; and
  - deleting the marks of each of the column blocks that is immediately after one of the column blocks whose data matches the first string data.

34. A method of selecting data of hierarchical structure using a data selecting device, the data selecting device of having:

- a memory element array composed of a plurality of memory elements and divided into a plurality of column blocks arranged in order; and
- selected data transferring means for comparing string data inputted from outside of the memory element array with data stored in the memory elements in each of the column blocks, selectively marking the column blocks according to the comparison results, and transferring the data stored in the memory elements in the marked column blocks in sequence to the outside of the memory cell array,
- wherein said selected data transferring means is divided into a plurality of column select units in correspondence to a plurality of the column blocks and provided with a data bus extending over a plurality of the column select units, each of the column block is provided with a column data line bundle for transferring read data; the column data line bundle is composed of a predetermined column data line and other column data lines; and each of the column select units comprises bit comparing and marking means for comparing data on the column data line bundle with the string data given by the string data bus, outputting the comparison result to the succeeding column block according to the comparison results and in response to a fifth signal, and marking the predetermined column data line on the basis of the comparison result given from the preceding column block, and
- wherein said bit comparing and marking means comprises string bit registering means for detecting and storing the string data on the string data bus, the data held by said string bit register means are three-value data composed of first, second and third values, when said string bit registering means stores the third data for a bit, the comparison result between the column data line bundle data and the string data of the bit is regarded as being matched with each other irrespective of the comparison result, said method of selecting data of hierarchical structure comprising the steps of:
inputting a first string data to the selected data transferring means;
comparing the inputted first string data with data stored in the memory elements in each of the column blocks;
marking each of the column blocks that is immediately after one of the column blocks whose data matches the first string data;
inputting a second string data to the selected data transferring means;
comparing the inputted second string data with data stored in the memory elements in each of the column blocks;
marking each of the column blocks that is immediately after one of the column blocks that was previously marked and whose data matches the second string data;
inputting the first string data again to the selected data transferring means;
comparing the inputted first string data with data stored in the memory elements in each of the column blocks; and
deleting the mark of each of the column blocks whose data matches the first string data.

35. A method of selecting data of hierarchical structure using a data selecting device, the data selecting device of having:
a memory element array composed of a plurality of memory elements and divided into a plurality of column blocks arranged in order; and
selected data transferring means for comparing string data inputted from outside of the memory element array with data stored in the memory elements in each of the column blocks, selectively marking the column blocks according to the comparison results, and transferring the data stored in the memory elements in the marked column blocks in sequence to the outside of the memory cell array,
wherein said selected data transferring means is divided into a plurality of column select units in correspondence to a plurality of the column blocks and provided with a data bus extending over a plurality of the column select units, each of the column block is provided with a column data line bundle for transferring read data; the column data line bundle is composed of a predetermined column data line and other column data lines; and each of the column select units comprises bit comparing and marking means for comparing data on the column data line bundle with the string data given by the string data bus, outputting the comparison result to the succeeding column block according to the comparison results and in response to a fifth signal, and marking the predetermined column data line on the basis of the comparison result given from the preceding column block, and wherein said bit comparing and marking means comprises string bit registering means for detecting and storing the string data on the string data bus, the data held by said string bit register means are three-value data composed of first, second and third values, when said string bit registering means stores the third data for a bit, the comparison result between the column data line bundle data and the string data of the bit is regarded as being matched with each other irrespective of the comparison result, said method comprising executing the steps of:
inputting a first string data to the selected data transferring means;
comparing the inputted first string data with data stored in the memory elements in each of the column blocks;
marking each of the column blocks that is immediately after one of the column blocks whose data matches the first string data;
and repeating the sub-steps of:
wherein the last data transferred and outputted in the preceding step or substep is data indicative of an end of a data string, ending the substeps; and
when the last data transferred and outputted in the preceding step or sub-step is not data indicative of the end of a data string, inputting the last data to the selected data transferring means as a next string data, comparing the next string data with the data stored in the memory elements in each of the column blocks, and marking each of the column blocks that is immediately after one of the column blocks whose data matches the next string data.

* * * * *